(12) United States Patent
Ozaki et al.

(10) Patent No.: US 10,468,514 B2
(45) Date of Patent: Nov. 5, 2019

(54) SEMICONDUCTOR DEVICE AND METHOD FOR PRODUCING THE SAME, POWER SUPPLY DEVICE, AND HIGH-FREQUENCY AMPLIFIER

(71) Applicant: FUJITSU LIMITED, Kawasaki-shi, Kanagawa (JP)

(72) Inventors: Shirou Ozaki, Yamato (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/664,318

(22) Filed: Jul. 31, 2017

(65) Prior Publication Data

US 2017/0352752 A1 Dec. 7, 2017

Related U.S. Application Data

(62) Division of application No. 14/167,216, filed on Jan. 29, 2014, now Pat. No. 9,755,061.

(30) Foreign Application Priority Data

Mar. 18, 2013 (JP) ................................. 2013-054928

(51) Int. Cl.
*H01L 29/778* (2006.01)
*H02M 3/335* (2006.01)
(Continued)

(52) U.S. Cl.
CPC .... *H01L 29/7786* (2013.01); *H01L 21/28264* (2013.01); *H01L 29/513* (2013.01);
(Continued)

(58) Field of Classification Search
CPC ..... H01L 9/66462; H01L 29/778–8128; H01L 29/51–513
See application file for complete search history.

(56) References Cited

U.S. PATENT DOCUMENTS

| 4,745,449 A | 5/1988 | Chang et al. |
| 2003/0160265 A1 | 8/2003 | Inoue et al. |

(Continued)

FOREIGN PATENT DOCUMENTS

| CN | 102237404 A | 11/2011 |
| CN | 102651388 A | 8/2012 |

(Continued)

OTHER PUBLICATIONS

Liu, Z. "High Microwave-Noise Performance of AlGaN/GaN MISHEMTs on Silicon With Al2O3 Gate Insulator Grown by ALD" IEEE Elec. Dev. Lett. vol. 31, No. 2 dated Feb. 2010 pp. 96-98).*

(Continued)

*Primary Examiner* — Grant S Withers
(74) *Attorney, Agent, or Firm* — Kratz, Quintos & Hanson, LLP

(57) ABSTRACT

A semiconductor device includes: a nitride semiconductor multilayer; an insulating film disposed on the nitride semiconductor multilayer; and a gate electrode disposed on the insulating film, wherein the nitride semiconductor multilayer has a first oxidized region near an interface with a region of the insulating film below the gate electrode, the first oxidized region having an oxygen concentration higher than an oxygen concentration of a region near an interface with a region of the insulating film other than below the gate electrode.

6 Claims, 10 Drawing Sheets

(51) Int. Cl.
- H03F 3/16 (2006.01)
- H01L 29/51 (2006.01)
- H01L 21/28 (2006.01)
- H03F 1/32 (2006.01)
- H01L 29/417 (2006.01)
- H01L 29/423 (2006.01)
- H01L 29/20 (2006.01)

(52) U.S. Cl.
CPC ...... H02M 3/33569 (2013.01); H03F 1/3247 (2013.01); H03F 3/16 (2013.01); H01L 29/2003 (2013.01); H01L 29/41766 (2013.01); H01L 29/4236 (2013.01); H01L 29/517 (2013.01)

(56) References Cited

U.S. PATENT DOCUMENTS

| | | |
|---|---|---|
| 2006/0011915 A1 | 1/2006 | Saito et al. |
| 2009/0140262 A1 | 6/2009 | Ohki et al. |
| 2010/0155781 A1 | 6/2010 | Suzuki et al. |
| 2010/0244018 A1 | 9/2010 | Kaneko |
| 2011/0193095 A1 | 8/2011 | Nakata et al. |
| 2011/0272741 A1 | 11/2011 | Hwang |
| 2011/0303952 A1* | 12/2011 | Hwang ............... H01L 29/267 257/194 |
| 2012/0091522 A1 | 4/2012 | Ozaki et al. |
| 2012/0098599 A1 | 4/2012 | Chang et al. |
| 2012/0168859 A1 | 6/2012 | Jin et al. |
| 2012/0181548 A1 | 7/2012 | Okada et al. |
| 2012/0205662 A1 | 8/2012 | Nakamura et al. |
| 2012/0211761 A1 | 8/2012 | Yamada |
| 2012/0218783 A1 | 8/2012 | Imada |
| 2012/0220105 A1 | 8/2012 | Ozaki et al. |
| 2012/0252173 A1 | 10/2012 | Imoto et al. |
| 2013/0075786 A1 | 3/2013 | Ishiguro |
| 2013/0082307 A1 | 4/2013 | Okamoto et al. |
| 2013/0082400 A1 | 4/2013 | Ohki et al. |
| 2013/0240896 A1 | 9/2013 | Ozaki |
| 2013/0256690 A1 | 10/2013 | Nakamura et al. |
| 2013/0292698 A1 | 11/2013 | Then et al. |
| 2014/0110760 A1 | 4/2014 | Nega et al. |
| 2014/0284613 A1 | 9/2014 | Kuraguchi et al. |
| 2014/0306231 A1 | 10/2014 | Ozaki et al. |
| 2014/0346526 A1 | 11/2014 | Kanamura |
| 2014/0367694 A1 | 12/2014 | Kamada et al. |
| 2015/0069405 A1 | 3/2015 | Yoshioka et al. |
| 2015/0069469 A1 | 3/2015 | Saito |
| 2015/0270355 A1 | 9/2015 | Kuraguchi et al. |
| 2015/0349107 A1 | 12/2015 | Liao |

FOREIGN PATENT DOCUMENTS

| | | |
|---|---|---|
| CN | 102810564 A | 12/2012 |
| CN | 103311290 A | 9/2013 |
| JP | 2003-258258 A | 9/2003 |
| JP | 2010-098141 A | 4/2010 |
| JP | 2010-238838 A | 10/2010 |
| JP | 2012-174875 A | 9/2012 |
| TW | 201242026 A | 10/2012 |
| TW | 201306129 A | 2/2013 |

OTHER PUBLICATIONS

Gaffey, B. "High-Quality Oxide/Nitride/Oxide Gate insulator for GaN MIS Structures" IEEE Transactions on Electron Dev. vol. 48, No. 3 Mar. 2001 pp. 458-464 (Year: 2001).*
Chinese Patent Application No. 201410056424.X: Office Action dated May 5, 2016.
Chinese Patent Application No. 201410056424.X: Second Office Action dated Jan. 19, 2017.
Japanese Patent Application No. 2013-054928: Office Action dated Oct. 4, 2016.
Taiwanese Patent Application No. 103103918: Office Action dated May 26, 2016.

* cited by examiner

TWO-DIMENSIONAL ELECTRON GAS (2DEG)

SEMICONDUCTOR DEVICE AND METHOD FOR PRODUCING THE SAME, POWER SUPPLY DEVICE, AND HIGH-FREQUENCY AMPLIFIER

CROSS-REFERENCE TO RELATED APPLICATIONS

This application is a divisional application of U.S. patent application Ser. No. 14/167,216, filed on Jan. 29, 2014, which is based upon and claims the benefit of priority of the prior Japanese Patent Application No. 2013-054928, filed on Mar. 18, 2013, the entire contents of which are incorporated herein by reference.

FIELD

The embodiments discussed herein are related to a semiconductor device and a method for producing the same, a power supply device, and a high-frequency amplifier.

BACKGROUND

Field-effect transistors that use GaN, such as GaN high electron mobility transistors (GaN-HEMTs), are used as, for example, semiconductor devices that use a nitride semiconductor.

GaN has excellent material properties such as high withstand voltage, relatively high mobility in the case of using a two-dimensional electron gas (2DEG), and high saturation velocity and therefore GaN-HEMTs are being developed as power devices for power supply applications that enable high-power, high-efficiency, and high-voltage operation. In other words, GaN-HEMTs are being developed as power devices for power supply applications that enable high-power, high-efficiency, and high-voltage operation which is not easily achieved by Si laterally diffused metal oxide semiconductor (LDMOS) transistors and GaAs field-effect transistors (FETs).

In the use of GaN-HEMTs in power supply applications, the threshold is desirably increased so that a normally-off operation in which no electric current flows when a gate voltage is not applied is achieved. For example, there are a technique that separates 2DEG by forming a gate recess and a technique that cancels out 2DEG by forming a p-type semiconductor layer directly below a gate electrode.

In some semiconductor devices that use a nitride semiconductor, a gate insulating film is disposed on the entire surface of a nitride semiconductor layer, that is, on the entire surface including not only a region directly below the gate electrode but also a region above a channel region (access region), and furthermore a gate electrode is formed on the gate insulating film. In some other semiconductor devices, a gate insulating film composed of aluminum oxide is formed using $O_2$ or $O_3$ with strong oxidizing power as an oxidizing raw material for the purpose of decreasing the C concentration in a gate insulating film and suppressing the leak current.

In the case where a gate insulating film is formed on the entire surface of a nitride semiconductor layer in semiconductor devices that use a nitride semiconductor, when an oxidized region is not formed near an interface of the nitride semiconductor layer with the gate insulating film or when an oxidized region is formed near the interface of the nitride semiconductor layer with the gate insulating film but the oxygen concentration is low, it has been found that a high drain current is achieved but the threshold is decreased.

On the other hand, when an oxidized region is formed near the interface of the nitride semiconductor layer with the gate insulating film and the oxygen concentration is high, it has been found that a high threshold is achieved but the drain current is decreased.

The following is reference document:
[Document 1] Japanese Laid-open Patent Publication No. 2010-98141 and
[Document 2] Japanese Laid-open Patent Publication No. 2010-238838.

SUMMARY

According to an aspect of the invention, a semiconductor device includes: a nitride semiconductor multilayer; an insulating film disposed on the nitride semiconductor multilayer; and a gate electrode disposed on the insulating film, wherein the nitride semiconductor multilayer has a first oxidized region near an interface with a region of the insulating film below the gate electrode, the first oxidized region having an oxygen concentration higher than an oxygen concentration of a region near an interface with a region of the insulating film other than below the gate electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, a semiconductor device and a method for producing the semiconductor device, a power supply device, and a high-frequency amplifier according to embodiments will be described with reference to the attached drawings.

[First Embodiment]

A semiconductor device and a method for producing the semiconductor device according to a first embodiment will now be described with reference to FIGS. 1 to 3.

The semiconductor device according to this embodiment is, for example, a semiconductor device having a nitride semiconductor multilayer structure that uses a nitride semiconductor.

In this embodiment, the semiconductor device is described using a FET that uses a nitride semiconductor, specifically a metal insulator semiconductor (MIS)-type AlGaN/GaN-HEMT, as an example. The MIS-type AlGaN/GaN-HEMT includes a nitride semiconductor multilayer structure (HEMT structure) including an electron transport layer composed of gallium nitride (GaN) and an electron supply layer composed of aluminum gallium nitride (AlGaN) and also includes a gate insulating film.

The AlGaN/GaN-HEMT is also referred to as an AlGaN/GaN-FET. The nitride semiconductor multilayer structure is also referred to as a group III-V nitride semiconductor multilayer structure, a GaN semiconductor multilayer structure, or a compound semiconductor multilayer structure. The semiconductor device is also referred to as a nitride semiconductor device, a group III-V nitride semiconductor device, or a compound semiconductor device.

Figure 1:
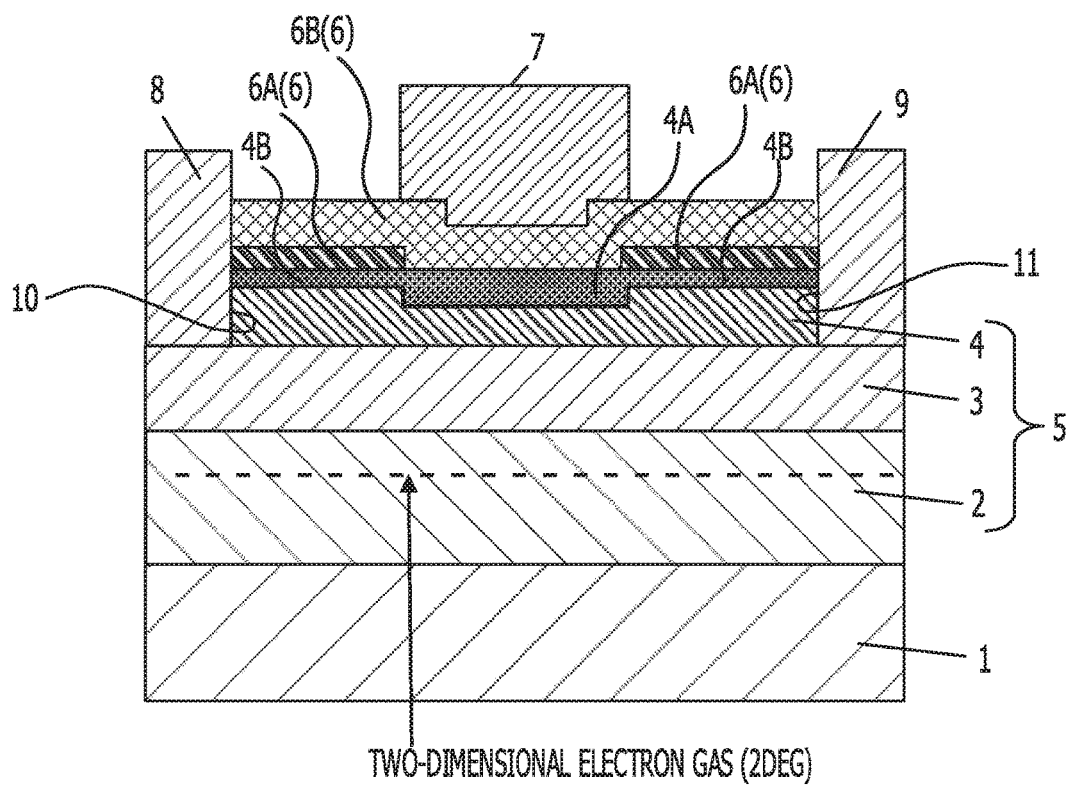
FIG. 1 is a schematic sectional view illustrating a structure of a semiconductor device according to a first embodiment.

As illustrated in FIG. 1, the MIS-type AlGaN/GaN-HEMT has a nitride semiconductor multilayer structure 5 including a GaN electron transport layer 2, an AlGaN electron supply layer 3, and a GaN capping layer 4 stacked on an SiC substrate 1. In this case, a two-dimensional electron gas (2DEG) is generated near the interface between the electron transport layer 2 and the electron supply layer 3. The presence of the capping layer 4 increases the strain between the electron transport layer 2 and the electron supply layer 3 to cause a piezoelectric effect, thereby increasing the 2DEG. This reduces the on-resistance of the AlGaN/GaN-HEMT and enables high-current operation. In FIG. 1, the 2DEG is indicated by a broken line. The SiC substrate 1 is also referred to as a substrate or a semiconductor substrate. A nucleation layer (buffer layer) may be optionally disposed between the substrate 1 and the electron transport layer 2. The electron transport layer 2, the electron supply layer 3, and the capping layer 4 are also referred to as group III-V nitride semiconductor layers or nitride semiconductor layers.

In this embodiment, an insulating film 6 is disposed on the nitride semiconductor multilayer structure 5 so as to cover the entire surface and a gate electrode 7 is disposed on the insulating film 6. In other words, the insulating film 6 is disposed on the GaN capping layer 4, which is a nitride semiconductor layer constituting an uppermost layer of the nitride semiconductor multilayer structure 5, so as to cover the entire surface and the gate electrode 7 is disposed on the insulating film 6. In a region of the insulating film 6 between the nitride semiconductor multilayer structure 5 and the gate electrode 7, the insulating film 6 functions as a gate insulating film. In a region other than the above region, the insulating film 6 functions as a surface protective film.

A source electrode 8 and a drain electrode 9 are disposed apart from each other with the gate electrode 7 disposed therebetween. In this embodiment, the source electrode 8 and the drain electrode 9 are respectively disposed in a source electrode groove 10 and a drain electrode groove 11 made in the nitride semiconductor multilayer structure 5. The source electrode groove 10 and the drain electrode groove 11 are grooves having a depth that reaches the electron supply layer 3. Therefore, the source electrode 8 and the drain electrode 9 are in contact with the electron supply layer 3. In other words, the source electrode 8 and the drain electrode 9 are disposed on the nitride semiconductor multilayer structure 5, that is, on the electron supply layer 3 included in the nitride semiconductor multilayer structure 5. The source electrode groove 10 and the drain electrode groove 11 are also referred to as electrode grooves or recesses.

In particular, in this embodiment, the insulating film 6 includes lower aluminum oxide films 6A disposed on regions of the GaN capping layer 4 other than below the gate electrode 7 and an upper aluminum oxide film 6B disposed on the lower aluminum oxide films 6A and on a region of the GaN capping layer 4 below the gate electrode 7. In other words, the insulating film 6 has a two-layer structure constituted by the lower aluminum oxide films 6A that are in contact with surfaces of the GaN capping layer 4 other than below the gate electrode 7 and the upper aluminum oxide film 6B stacked on the lower aluminum oxide films 6A so as to be in contact with a surface of the GaN capping layer 4 below the gate electrode 7. In this case, the surface of the GaN capping layer 4 is covered with the upper aluminum oxide film 6B in a region below the gate electrode 7 and the lower aluminum oxide films 6A in regions other than below the gate electrode 7. The lower aluminum oxide films 6A are also referred to as lower oxide insulating films. The upper aluminum oxide film 6B is also referred to as an upper oxide insulating film. The aluminum oxide films 6A and 6B are also referred to as AlO films (for example, $Al_2O_3$ films).

The lower aluminum oxide films 6A are formed using an oxidation process that uses a raw material gas containing $H_2O$, such as a steam oxidation process, as described below. The upper aluminum oxide film 6B is formed using an oxidation process that uses a raw material gas containing $O_2$ or $O_3$, such as an oxygen plasma oxidation process, as described below. Therefore, the upper aluminum oxide film 6B has a film density higher than those of the lower aluminum oxide films 6A. The upper aluminum oxide film 6B, that is, the aluminum oxide film formed using the oxidation process that uses a raw material gas containing $O_2$ or $O_3$ has a film density of about 3.3 $g/cm^3$. The lower aluminum oxide films 6A, that is, the aluminum oxide films formed using the oxidation process that uses a raw material gas containing $H_2O$ have a film density of about 2.9 $g/cm^3$. For example, the upper aluminum oxide film 6B, that is, the aluminum oxide film formed using the oxidation process that uses a raw material gas containing $O_2$ or $O_3$ has a film density of 3.0 $g/cm^3$ or more.

In this case, when the lower aluminum oxide films 6A and the upper aluminum oxide film 6B are formed on the GaN capping layer 4, a near-surface portion of the GaN capping layer 4 is oxidized and thus a first oxidized region 4A and second oxidized regions 4B are formed in the GaN capping layer 4. More specifically, when the lower aluminum oxide films 6A are formed on the GaN capping layer 4, near-surface portions of the GaN capping layer 4 are oxidized and thus the second oxidized regions 4B are formed in the GaN capping layer 4. When the upper aluminum oxide film 6B is formed on the GaN capping layer 4, a near-surface portion of the GaN capping layer 4 is oxidized and thus the first oxidized region 4A is formed in the GaN capping layer 4.

In this case, the GaN capping layer 4 has an oxidized region (first oxidized region) 4A near the interface with a region of the insulating film 6 (upper aluminum oxide film 6B) below the gate electrode 7 and oxidized regions (second oxidized regions) 4B near the interfaces with regions of the insulating film 6 (lower aluminum oxide films 6A) other than below the gate electrode 7. Herein, the gate electrode 7 is disposed above the first oxidized region 4A of the GaN capping layer 4 with the insulating film 6 (upper aluminum oxide film 6B) sandwiched therebetween. The GaN capping layer 4 is also referred to as a gallium nitride layer or a nitride semiconductor layer. The oxidized regions 4A and 4B are also referred to as oxidized layers, GaN oxidized regions, or GaN oxidized layers.

The first oxidized region 4A has an oxygen concentration higher than those of the second oxidized regions 4B. In other words, the first oxidized region 4A has an oxygen concentration higher than those of regions near the interfaces with regions of the insulating film 6 other than below the gate electrode 7. The thickness of the first oxidized region 4A is larger than those of the second oxidized regions 4B. For example, the thickness (depth) of the first oxidized region 4A is larger than about 2 nm. The oxidized regions 4A and 4B contain GaO, GaON, and the like.

Figure 2:
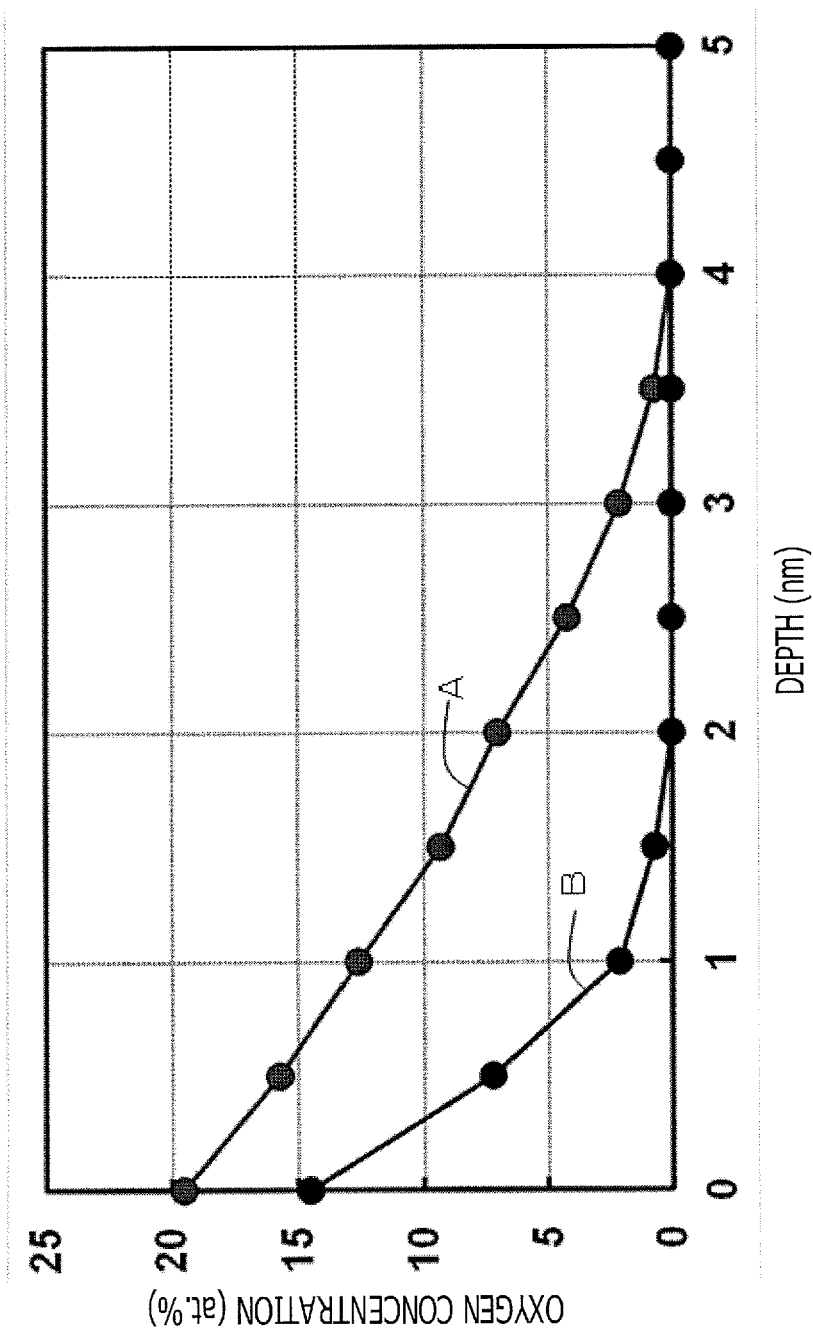
FIG. 2 is a graph illustrating the relationship between the oxygen concentration and the depths (thicknesses) of oxidized regions formed by an oxygen plasma oxidation process and a steam oxidation process.

FIG. 2 illustrates the measurement results of the oxygen concentration and the thickness (depth from interface) of the oxidized regions formed near the interface of the nitride semiconductor layer with the insulating film (near the interface of the GaN layer with the aluminum oxide film), the measurement results being obtained by X-ray photoelectron spectroscopy. In FIG. 2, a solid line A indicates the relationship between the oxygen concentration and the thickness of the oxidized regions formed in the GaN layer when the aluminum oxide film is formed using the oxygen plasma oxidation process as an oxidation process that uses a raw material gas containing $O_2$ or $O_3$. In FIG. 2, a solid line B indicates the relationship between the oxygen concentration and the thickness of the oxidized regions formed in the GaN layer when the aluminum oxide film is formed using the steam oxidation process as an oxidation process that uses a raw material gas containing $H_2O$.

As indicated by the solid line B in FIG. 2, when the aluminum oxide film is formed using the steam oxidation process as an oxidation process that uses a raw material gas containing $H_2O$, the thickness of the oxidized region formed in the GaN layer is about 2 nm. On the other hand, as indicated by the solid line A in FIG. 2, when the aluminum oxide film is formed using the oxygen plasma oxidation process as an oxidation process that uses a raw material gas containing $O_2$ or $O_3$, the thickness of the oxidized region formed in the GaN layer is about 4 nm. It is found from above that, as indicated by the solid lines A and B in FIG. 2, the thickness (depth) of the oxidized region formed in the GaN layer is larger in the case where the aluminum oxide film is formed using the oxygen plasma oxidation process as an oxidation process that uses a raw material gas containing $O_2$ or $O_3$ than in the case where the aluminum oxide film is formed using the steam oxidation process as an oxidation process that uses a raw material gas containing $H_2O$.

Specifically, when the aluminum oxide film is formed using the oxygen plasma oxidation process as an oxidation process that uses a raw material gas containing $O_2$ or $O_3$, the thickness of the oxidized region formed in the GaN layer is larger than about 2 nm. It is also found that, as indicated by the solid lines A and B in FIG. 2, the oxygen concentration of the oxidized region formed in the GaN layer is higher in the case where the aluminum oxide film is formed using the oxygen plasma oxidation process as an oxidation process that uses a raw material gas containing $O_2$ or $O_3$ than in the case where the aluminum oxide film is formed using the steam oxidation process as an oxidation process that uses a raw material gas containing $H_2O$. The oxygen concentration is high in the entire oxidized region and the oxygen concentration is high at any depth in the oxidized region. This may be because the oxidation of the GaN layer is facilitated by active oxygen contained in oxygen plasma, such as a radical.

The reason why, as described above, the oxidized region (first oxidized region) 4A having an oxygen concentration higher than those of regions near the interfaces with the regions of the insulating film 6 other than below the gate electrode 7 is formed near the interface of the GaN capping layer 4 with the region of the insulating film 6 below the gate electrode 7 is found to be as follows.

When the aluminum oxide film is formed as an insulating film on the entire surface of the GaN capping layer using an oxidation process (for example, steam oxidation process) that uses a raw material gas containing $H_2O$, an oxidized region having a low oxygen concentration is formed near the interface of the GaN capping layer with the insulating film. This increases the drain current, but decreases the threshold as indicated by a solid line A in FIG. 3.

On the other hand, when the aluminum oxide film is formed as an insulating film on the entire surface of the GaN capping layer using an oxidation process (for example, oxygen plasma oxidation process) that uses a raw material gas containing $O_2$ or $O_3$, an oxidized region having a high oxygen concentration is formed near the interface of the GaN capping layer with the insulating film. This increases the threshold, but decreases the drain current as indicated by a solid line B in FIG. 3.

The following is found from above. When the aluminum oxide film is formed as an insulating film using an oxidation process (for example, oxygen plasma oxidation process) that uses a raw material gas containing $O_2$ or $O_3$, an oxidized region having a high oxygen concentration is formed near the interface of the GaN capping layer with the insulating film, which shifts the threshold to the positive side. However, if the oxidized region having a high oxygen concentration is also formed in an access region by forming the aluminum oxide film on the entire surface, the drain current decreases compared with the case where the aluminum oxide film is formed using an oxidation process (for example, steam oxidation process) that uses a raw material gas containing $H_2O$.

To avoid this, as described above, the upper aluminum oxide film 6B is formed as the insulating film 6 on a region of the GaN capping layer 4 below the gate electrode 7 using an oxidation process (for example, oxygen plasma oxidation process) that uses a raw material gas containing $O_2$ or $O_3$. Thus, when the upper aluminum oxide film 6B is formed, an oxidized region having a high oxygen concentration, that is, the oxidized region (first oxidized region) 4A having a deep electron trap is formed in a portion of the GaN capping layer 4 below (herein, directly below) the gate electrode 7. This increases the threshold.

On the other hand, the lower aluminum oxide films 6A are formed as the insulating film 6 in portions of the GaN capping layer 4 other than below the gate electrode 7, that is, above access regions using an oxidation process (for example, steam oxidation process) that uses a raw material gas containing $H_2O$. The purpose of this is to avoid, as much as possible, the formation of an oxidized region having a high oxygen concentration, that is, an oxidized region having a deep electron trap in the portions of the GaN capping layer 4 other than below the gate electrode 7. In other words, the oxidized regions (second oxidized regions) 4B having an oxygen concentration lower than that of the portion of the GaN capping layer 4 below the gate electrode 7 are formed in the portions of the GaN capping layer 4 other than below the gate electrode 7. This suppresses the decrease in drain current.

Figure 3:
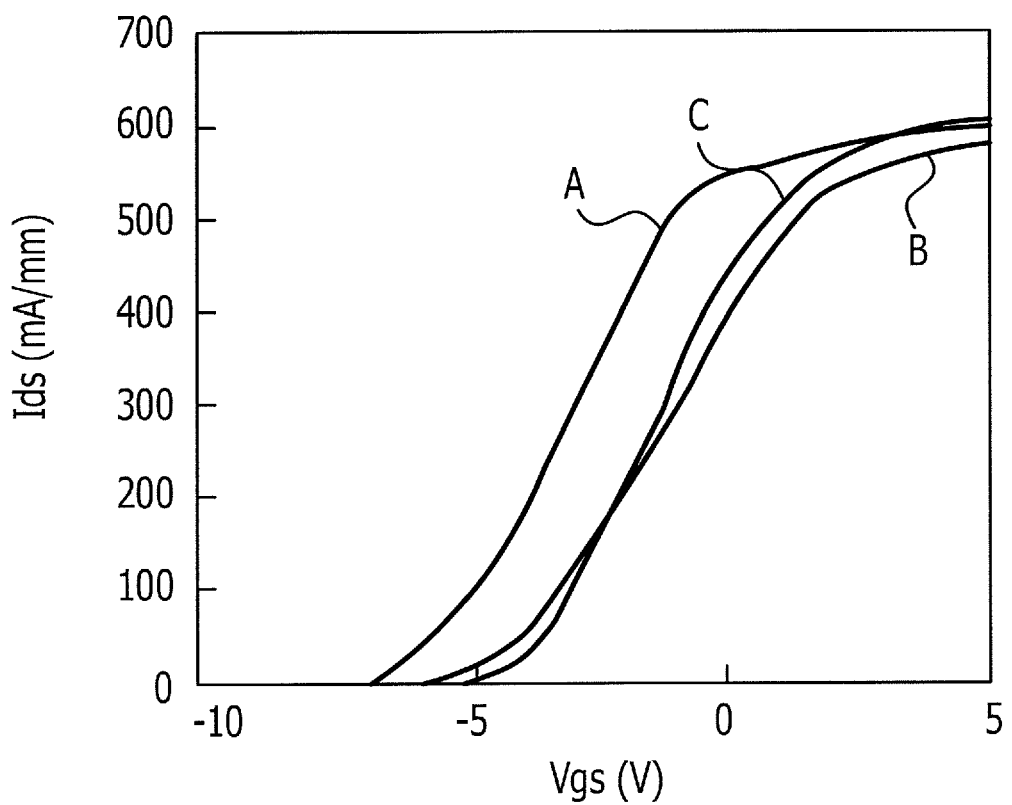
FIG. 3 is a graph for describing the advantageous effects of the present disclosure.

As described above, by using, as the insulating film 6, a hybrid aluminum oxide film obtained by combining the upper aluminum oxide film 6B formed using an oxidation process that uses a raw material gas containing $O_2$ or $O_3$ and the lower aluminum oxide films 6A formed using an oxidation process that uses a raw material gas containing $H_2O$, a positive threshold is achieved while high drain current is maintained, for example, as indicated by a solid line C in FIG. 3. When the aluminum oxide film is formed using an oxidation process that uses a raw material gas containing $O_2$ or $O_3$, the oxidation of the GaN capping layer 4 near the surface proceeds compared with the case where the aluminum oxide film is formed using an oxidation process that uses a raw material gas containing $H_2O$.

As a result, a deeper electron trap is formed. Examples of such an electron trap include Ga vacancies and Ga vacancy-oxygen pair defects. Therefore, by forming the upper aluminum oxide film 6B only on a region of the GaN capping layer 4 below the gate electrode 7 using an oxidation process that uses a raw material gas containing $O_2$ or $O_3$, the oxidized region 4A having a deeper electron trap is formed below the gate electrode 7. As a result, electrons in the 2DEG are trapped and thus a positive threshold is achieved. By forming the lower aluminum oxide films 6A on regions of the GaN capping layer 4 other than below the gate electrode 7 using an oxidation process that uses a raw material gas containing $H_2O$, high drain current is maintained. Accordingly, the threshold is increased while the decrease in drain current is suppressed.

A method for producing the semiconductor device (MIS-type AlGaN/GaN-HEMT) according to this embodiment will now be described.

First, GaN, AlGaN, and GaN are sequentially deposited on a SiC substrate 1 by, for example, a metal organic vapor phase epitaxy (MOVPE) method. For example, i-GaN, i-AlGaN, n-AlGaN, and n-GaN are sequentially deposited on a semi-insulating SiC substrate 1. Thus, a nitride semiconductor multilayer structure 5 including a GaN electron transport layer 2, an AlGaN electron supply layer 3, and a GaN capping layer 4 stacked on the SiC substrate 1 is formed. A molecular beam epitaxy (MBE) method or the like may be used instead of the MOVPE method.

A source electrode groove 10 and a drain electrode groove 11 are then respectively formed in a source electrode formation region (a region in which a source electrode is to be formed) and a drain electrode formation region (a region in which a drain electrode is to be formed) of the nitride semiconductor multilayer structure 5. That is, portions of the capping layer 4 and electron supply layer 3 in the source electrode formation region and drain electrode formation region are removed by, for example, lithography and dry etching that uses chlorine gas or the like to form a source electrode groove 10 and a drain electrode groove 11. Thus, grooves that penetrate through the capping layer 4 and reach a predetermined depth in the electron supply layer 3 are formed as the source electrode groove 10 and drain electrode groove 11. The depth of the etching may be set so that grooves that reach the predetermined depth in the electron supply layer 3 are formed as the source electrode groove 10 and drain electrode groove 11. The depth of the etching is not particularly limited. For example, the depth of the etching may be a depth that reaches the electron transport layer 2.

An insulating film 6 is then formed on the nitride semiconductor multilayer structure 5 so as to cover the entire surface.

In this embodiment, as the insulating film 6, lower aluminum oxide films 6A are formed on regions of the GaN capping layer 4 other than below a gate electrode formation region (a region in which a gate electrode is to be formed) and an upper aluminum oxide film 6B is formed on the lower aluminum oxide films 6A and on a region of the GaN capping layer 4 below the gate electrode formation region.

Herein, the surface of the nitride semiconductor multilayer structure 5 is washed with a sulfuric acid-hydrogen peroxide mixture or the like, and an altered layer is washed with hydrofluoric acid and then washing with water is performed.

A lower aluminum oxide film 6A is then formed on the GaN capping layer 4 by, for example, an atomic layer deposition (ALD) method using an oxidation process (steam oxidation process) that uses a raw material gas containing $H_2O$. The thickness of the lower aluminum oxide film 6A may be, for example, about 5 nm to 10 nm and is herein about 10 nm. A chemical vapor deposition (CVD) method or the like may be employed instead of the ALD method.

A portion of the lower aluminum oxide film 6A below the gate electrode formation region is then selectively removed by, for example, wet etching that uses tetramethylammonium hydroxide (TMAH). Thus, lower aluminum oxide films 6A are formed on regions of the GaN capping layer 4 other than below the gate electrode formation region.

An upper aluminum oxide film 6B is then formed on the lower aluminum oxide films 6A and on a region of the GaN capping layer 4 below the gate electrode formation region by, for example, an ALD method using an oxidation process (oxygen plasma oxidation process) that uses a raw material gas containing $O_2$ or $O_3$. The thickness of the upper aluminum oxide film 6B may be, for example, about 10 nm to 100 nm and is herein about 40 nm. A CVD method or the like may be employed instead of the ALD method.

The insulating film 6 is then subjected to an annealing treatment at a temperature of, for example, about 500° C. to 800° C.

Thus, an insulating film having a two-layer structure constituted by the lower aluminum oxide films 6A that are in contact with surfaces of the GaN capping layer 4 other than below the gate electrode formation region and the upper aluminum oxide film 6B stacked on the lower aluminum oxide films 6A so as to be in contact with a surface of the GaN capping layer 4 below the gate electrode formation region is formed as the insulating film 6. In this case, the upper aluminum oxide film 6B has a film density higher than those of the lower aluminum oxide films 6A.

Herein, the upper aluminum oxide film 6B, that is, the aluminum oxide film formed using the oxidation process that uses a raw material gas containing $O_2$ or $O_3$ has a film density of about 3.3 g/cm$^3$. The lower aluminum oxide films 6A, that is, the aluminum oxide films formed using the oxidation process that uses a raw material gas containing $H_2O$ have a film density of about 2.9 g/cm$^3$. For example, the upper aluminum oxide film 6B, that is, the aluminum oxide film formed using the oxidation process that uses a raw material gas containing $O_2$ or $O_3$ has a film density of 3.0 g/cm$^3$ or more. Thus, the surface of the GaN capping layer 4 is covered with the upper aluminum oxide film 6B in a region below the gate electrode formation region and the lower aluminum oxide films 6A in regions other than below the gate electrode formation region.

In this case, when the lower aluminum oxide films 6A and the upper aluminum oxide film 6B are formed on the GaN capping layer 4, a near-surface portion of the GaN capping layer 4 is oxidized and thus a first oxidized region 4A and second oxidized regions 4B are formed in the GaN capping layer 4. More specifically, when the lower aluminum oxide films 6A are formed on the GaN capping layer 4, near-surface portions of the GaN capping layer 4 are oxidized and thus the second oxidized regions 4B are formed in the GaN capping layer 4. When the upper aluminum oxide film 6B is formed on the GaN capping layer 4, a near-surface portion of the GaN capping layer 4 is oxidized and thus the first oxidized region 4A is formed in the GaN capping layer 4.

In this case, the GaN capping layer 4 has an oxidized region (first oxidized region) 4A near the interface with the upper aluminum oxide film 6B which is present below the gate electrode formation region and oxidized regions (second oxidized regions) 4B near the interfaces with the lower aluminum oxide films 6A which are present other than below the gate electrode formation region. The first oxidized region 4A has an oxygen concentration higher than those of the second oxidized regions 4B. In other words, the first oxidized region 4A has an oxygen concentration higher than those of regions near the interfaces with regions of the insulating film 6 other than below the gate electrode formation region. The thickness of the first oxidized region 4A is larger than those of the second oxidized regions 4B. For example, the thickness (depth) of the first oxidized region 4A is larger than about 2 nm. The oxidized regions 4A and 4B contain GaO, GaON, and the like.

A source electrode 8 and a drain electrode 9 are then formed. That is, the lower aluminum oxide films 6A and the upper aluminum oxide film 6B formed in each of the source electrode groove 10 and drain electrode groove 11 respectively disposed in a source electrode formation region and a drain electrode formation region are removed by, for example, wet etching that uses TMAH.

The source electrode groove 10 and the drain electrode groove 11 are then filled with, for example, Ta/Al serving as a material for a source electrode 8 and a drain electrode 9 by, for example, a vapor deposition method and a lift-off method. Ta/Al is further deposited so as to protrude from the source electrode groove 10 and the drain electrode groove 11.

An annealing treatment is then performed at a temperature of, for example, about 550° C. to form an ohmic contact. Thus, a source electrode 8 and a drain electrode 9 serving as a pair of ohmic electrodes are formed.

A gate electrode 7 is then formed on the insulating film 6 (upper aluminum oxide film 6B).

In this embodiment, a gate electrode 7 is formed above the first oxidized region 4A of the GaN capping layer 4 with the insulating film 6 (upper aluminum oxide film 6B) sandwiched therebetween.

Herein, for example, Ni/Au is used as a material for the gate electrode 7. The gate electrode 7 is formed by depositing Ni/Au on the insulating film 6 (upper aluminum oxide film 6B) above the first oxidized region 4A of the GaN capping layer 4 by, for example, a vapor deposition method and a lift-off method and then performing an annealing treatment at a temperature of, for example, about 300° C. to 400° C.

Subsequently, processes for forming a protective film, a contact hole, a wiring line, and the like (not illustrated) are performed to complete a semiconductor device (MIS-type AlGaN/GaN-HEMT).

The semiconductor device and the method for producing the semiconductor device according to this embodiment offer an advantage in that a high threshold is achieved while a decrease in drain current is suppressed.

In the above embodiment, the aluminum oxide film (oxide insulating film) is used as the insulating film 6, but the insulating film 6 is not limited thereto. For example, an insulating film containing at least one oxide or oxynitride selected from the group consisting of aluminum, hafnium, tantalum, zirconium, and silicon may be used as the insulating film 6. In other words, the insulating film may include lower oxide insulating films or lower oxynitride insulating films disposed on regions of the nitride semiconductor multilayer structure other than below the gate electrode and an upper oxide insulating film or an upper oxynitride insulating film disposed on the lower oxide insulating films or the lower oxynitride insulating films and on a region of the nitride semiconductor multilayer structure below the gate electrode.

In the above embodiment, an AlGaN/GaN-HEMT in which the electron transport layer is composed of GaN and the electron supply layer is composed of AlGaN has been exemplified as a semiconductor device, but the semiconductor device is not limited thereto. For example, this embodiment is also applicable to an InAlN/GaN-HEMT in which the electron transport layer is composed of GaN and the electron supply layer is composed of InAlN or an InAlGaN/GaN-HEMT in which the electron transport layer is composed of GaN and the electron supply layer is composed of InAlGaN. This embodiment is also applicable to semiconductor devices having another nitride semiconductor multilayer structure.

For example, the nitride semiconductor multilayer structure 5 may include at least the electron supply layer 3 and electron transport layer 2 and does not necessarily include the capping layer 4. In this case, the nitride semiconductor layer (electron supply layer 3) constituting an uppermost layer of the nitride semiconductor multilayer structure 5 has an oxidized region (first oxidized region) 4A near the interface with a region of the insulating film 6 below the gate electrode 7, the oxidized region 4A having an oxygen concentration higher than those of regions near the interfaces with regions of the insulating film 6 other than below the gate electrode 7. Furthermore, the nitride semiconductor layer has second oxidized regions 4B having an oxygen concentration lower than that of the first oxidized region 4A near the interfaces with regions of the insulating film 6 other than below the gate electrode 7. Herein, the electron supply layer 3 is an AlGaN layer. Therefore, the first oxidized region 4A and the second oxidized regions 4B of the nitride semiconductor multilayer structure 5 are oxidized regions composed of AlGaN.

Figure 4:
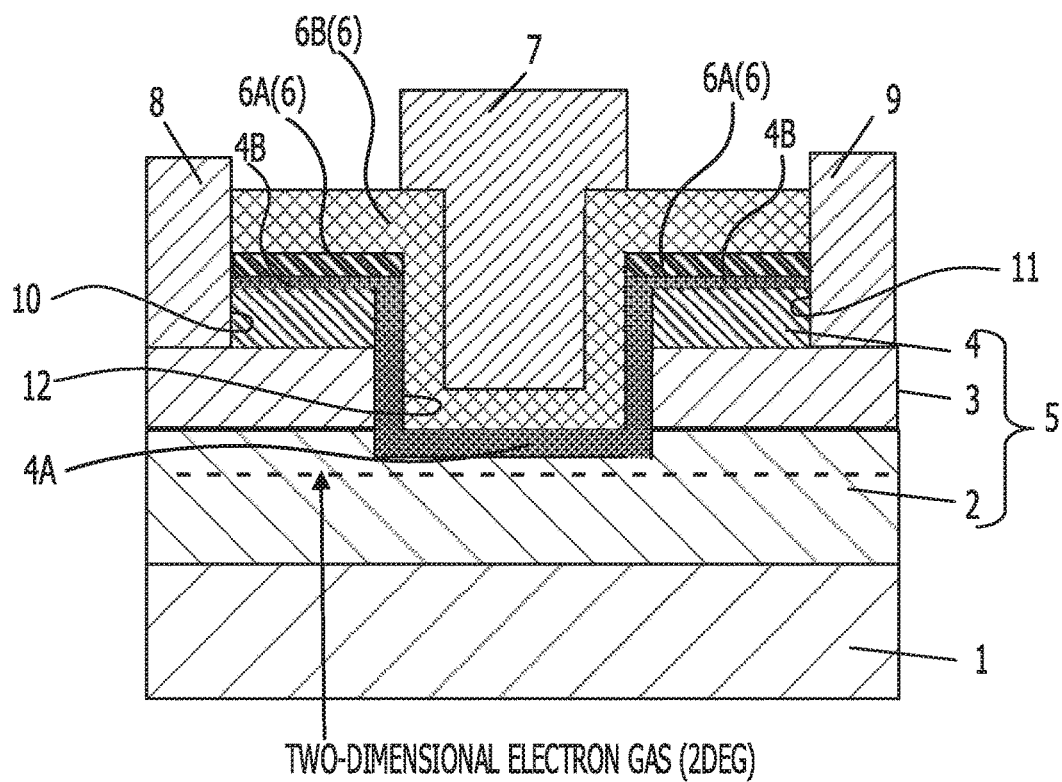
FIG. 4 is a schematic sectional view illustrating a structure of a semiconductor device according to a modification of the first embodiment.

In the above embodiment, an HEMT having no gate recess has been exemplified as a semiconductor device, but the semiconductor device is not limited thereto. For example, this embodiment is also applicable to an HEMT having a gate recess 12 as illustrated in FIG. 4.

In the case of the HEMT having a gate recess 12, the nitride semiconductor multilayer structure 5 of the above embodiment may be changed to a nitride semiconductor multilayer structure having a gate recess 12 and the gate electrode 7 may be disposed in the gate recess 12. In other words, the nitride semiconductor multilayer structure 5 may be changed to a nitride semiconductor multilayer structure having a gate recess 12 in which the gate electrode 7 is disposed. For example, part of the gate electrode 7 may be embedded in the gate recess 12. Furthermore, for example, a groove having a depth that reaches the electron transport layer 2 may be formed as the gate recess 12. In this case, the gate electrode 7 is disposed above the nitride semiconductor multilayer structure 5, that is, above the electron transport layer 2 included in the nitride semiconductor multilayer structure 5. The electron transport layer 2 included in the nitride semiconductor multilayer structure 5 has a first oxidized region 4A near the interface with a region of the insulating film 6 below the gate electrode 7, the first oxidized region 4A having an oxygen concentration higher than those of regions near the interfaces with regions of the insulating film 6 other than below the gate electrode 7.

Herein, the electron transport layer 2 is a GaN layer. Therefore, the first oxidized region 4A of the nitride semiconductor multilayer structure 5 is an oxidized region composed of GaN. Furthermore, the nitride semiconductor layer (capping layer 4) constituting an uppermost layer of the nitride semiconductor multilayer structure 5 has second oxidized regions 4B having an oxygen concentration lower than that of the first oxidized region 4A near the interfaces with regions of the insulating film 6 other than below the gate electrode 7. Herein, the capping layer 4 is a GaN layer. Therefore, the second oxidized regions 4B of the nitride semiconductor multilayer structure 5 are oxidized regions composed of GaN. The gate recess 12 is also referred to as a recess, a recess opening, or an electrode groove.

The gate recess 12 may have a depth that reaches the electron supply layer 3. In this case, the gate electrode 7 is disposed above the nitride semiconductor multilayer structure 5, that is, above the electron supply layer 3 included in the nitride semiconductor multilayer structure 5. The electron supply layer 3 included in the nitride semiconductor multilayer structure 5 has a first oxidized region 4A near the interface with a region of the insulating film 6 below the gate electrode 7, the first oxidized region 4A having an oxygen concentration higher than those of regions near the interfaces with regions of the insulating film 6 other than below the gate electrode 7. Herein, the electron supply layer 3 is an AlGaN layer. Therefore, the first oxidized region 4A of the nitride semiconductor multilayer structure 5 is an oxidized region composed of AlGaN. When the electron supply layer 3 is composed of InAlN or InAlGaN, the first oxidized region 4A of the nitride semiconductor multilayer structure 5 is an oxidized region composed of InAlN or InAlGaN.

For example, the nitride semiconductor multilayer structure 5 having the gate recess 12 may include at least the electron supply layer 3 and electron transport layer 2 and does not necessarily include the capping layer 4. In this case, the nitride semiconductor layer (electron supply layer 3) constituting an uppermost layer of the nitride semiconductor multilayer structure 5 has an oxidized region (first oxidized region) 4A near the interface with a region of the insulating film 6 below the gate electrode 7, the oxidized region 4A having an oxygen concentration higher than those of regions near the interfaces with regions of the insulating film 6 other than below the gate electrode 7. Furthermore, the nitride semiconductor layer has second oxidized regions 4B having an oxygen concentration lower than that of the first oxidized region 4A near the interfaces with regions of the insulating film 6 other than below the gate electrode 7. Herein, the electron supply layer 3 is an AlGaN layer. Therefore, the first oxidized region 4A and the second oxidized regions 4B of the nitride semiconductor multilayer structure 5 are oxidized regions composed of AlGaN.

A HEMT having such a gate recess 12 may be produced by a method below. In the production method of the above embodiment, a gate recess 12 is formed after the source electrode groove 10 and the drain electrode groove 11 are formed. Subsequently, the insulating film 6 is formed, the source electrode 8 and the drain electrode 9 are formed, and the gate electrode 7 is formed.

In the process for forming the gate recess 12, the gate recess 12 may be formed in a gate electrode formation region (a region in which a gate electrode is to be formed) of the nitride semiconductor multilayer structure 5. That is, portions of the capping layer 4 and electron supply layer 3 in the gate electrode formation region may be removed by, for example, lithography and dry etching that uses chlorine gas, fluorine gas, or the like to form the gate recess 12. Thus, a groove having a depth that reaches the electron transport layer 2 may be formed as the gate recess 12. Herein, a groove having a depth that reaches the electron transport layer 2 is formed as the gate recess 12, but the structure is not limited thereto. For example, a groove having a depth that reaches the electron supply layer 3 may be formed as the gate recess 12.

[Second Embodiment]

A semiconductor device and a method for producing the semiconductor device according to a second embodiment will now be described with reference to FIG. 5.

The semiconductor device according to this embodiment is different from the semiconductor device according to the first embodiment in terms of the insulating film 6. In other words, in the first embodiment, the lower aluminum oxide films 6A are films formed using an oxidation process that uses a raw material gas containing $H_2O$, such as a steam oxidation process, and the upper aluminum oxide film 6B is a film formed using an oxidation process that uses a raw material gas containing $O_2$ or $O_3$, such as an oxygen plasma oxidation process. On the other hand, in this embodiment, the lower aluminum oxide film 6A is a film formed using an oxidation process that uses a raw material gas containing $O_2$ or $O_3$, such as an oxygen plasma oxidation process, and the upper aluminum oxide film 6B is a film formed using an oxidation process that uses a raw material gas containing $H_2O$, such as a steam oxidation process.

Figure 5:
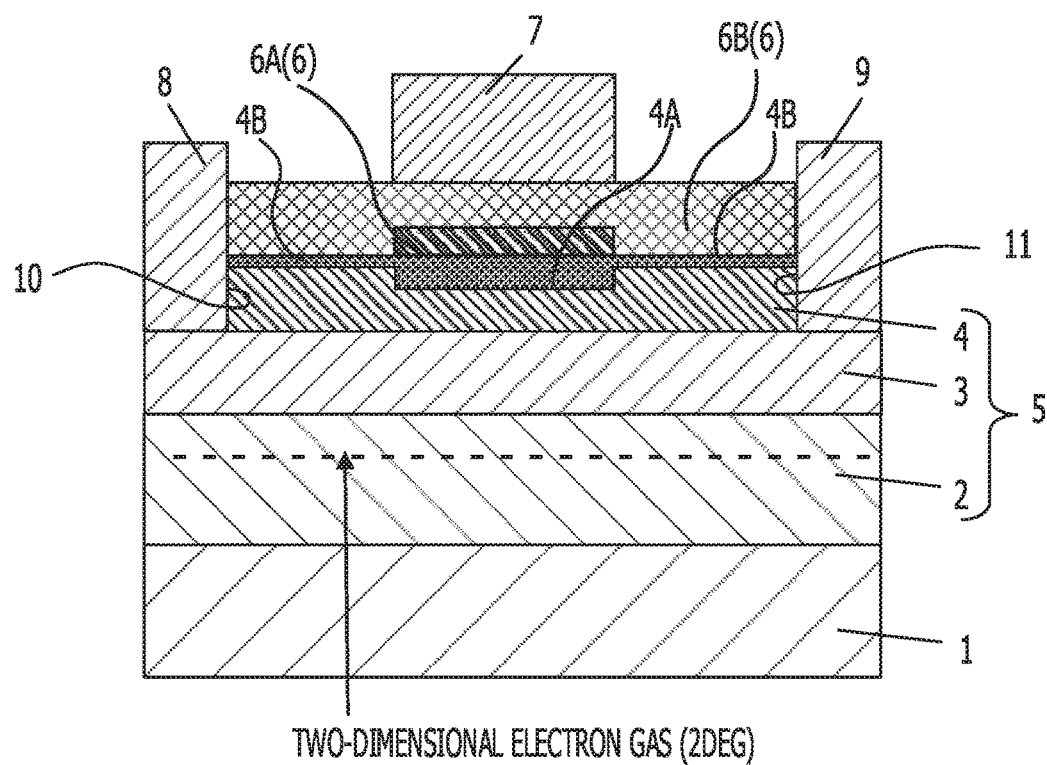
FIG. 5 is a schematic sectional view illustrating a structure of a semiconductor device according to a second embodiment.

Specifically, as illustrated in FIG. 5, the semiconductor device includes, as the insulating film 6, a lower aluminum oxide film 6A disposed on a region of the GaN capping layer 4 below the gate electrode 7, the GaN capping layer 4 constituting an uppermost layer of the nitride semiconductor multilayer structure 5, and an upper aluminum oxide film 6B disposed on the lower aluminum oxide film 6A and on regions of the GaN capping layer 4 other than below the gate electrode 7. In other words, the insulating film 6 has a two-layer structure constituted by the lower aluminum oxide film 6A that is in contact with a surface of the GaN capping layer 4 below the gate electrode 7 and the upper aluminum oxide film 6B stacked on the lower aluminum oxide film 6A so as to be in contact with surfaces of the GaN capping layer 4 other than below the gate electrode 7. In this case, the surface of the GaN capping layer 4 is covered with the lower aluminum oxide film 6A in a region below the gate electrode 7 and the upper aluminum oxide film 6B in regions other than below the gate electrode 7. The lower aluminum oxide film 6A is also referred to as a lower oxide insulating film. The upper aluminum oxide film 6B is also referred to as an upper oxide insulating film.

The lower aluminum oxide film 6A is formed using an oxidation process that uses a raw material gas containing $O_2$ or $O_3$, such as an oxygen plasma oxidation process, as described below. The upper aluminum oxide film 6B is formed using an oxidation process that uses a raw material gas containing $H_2O$, such as a steam oxidation process, as described below. Therefore, the lower aluminum oxide film 6A has a film density higher than that of the upper aluminum oxide film 6B. The upper aluminum oxide film 6B, that is, the aluminum oxide film formed using the oxidation process that uses a raw material gas containing $H_2O$ has a film density of about 2.9 $g/cm^3$. The lower aluminum oxide film 6A, that is, the aluminum oxide film formed using the oxidation process that uses a raw material gas containing $O_2$ or $O_3$ has a film density of about 3.3 $g/cm^3$. For example, the lower aluminum oxide film 6A, that is, the aluminum oxide film formed using the oxidation process that uses a raw material gas containing $O_2$ or $O_3$ has a film density of 3.0 $g/cm^3$ or more.

In this case, when the lower aluminum oxide film 6A and the upper aluminum oxide film 6B are formed on the GaN capping layer 4, a near-surface portion of the GaN capping layer 4 is oxidized and thus a first oxidized region 4A and second oxidized regions 4B are formed in the GaN capping layer 4. More specifically, when the lower aluminum oxide film 6A is formed on the GaN capping layer 4, a near-surface portion of the GaN capping layer 4 is oxidized and thus the first oxidized region 4A is formed in the GaN capping layer 4. When the upper aluminum oxide film 6B is formed on the GaN capping layer 4, near-surface portions of the GaN capping layer 4 are oxidized and thus the second oxidized regions 4B are formed in the GaN capping layer 4.

In this case, the GaN capping layer 4 has an oxidized region (first oxidized region) 4A near the interface with a region of the insulating film 6 (lower aluminum oxide film 6A) below the gate electrode 7 and oxidized regions (second oxidized regions) 4B near the interfaces with regions of the insulating film 6 (upper aluminum oxide film 6B) other than below the gate electrode 7. Herein, the gate electrode 7 is disposed above the first oxidized region 4A of the GaN capping layer 4 with the insulating film 6 (lower aluminum oxide film 6A) sandwiched therebetween. The GaN capping layer 4 is also referred to as a gallium nitride layer or a nitride semiconductor layer. The oxidized regions 4A and 4B are also referred to as oxidized layers, GaN oxidized regions, or GaN oxidized layers.

The first oxidized region 4A has an oxygen concentration higher than those of the second oxidized regions 4B. In other words, the first oxidized region 4A has an oxygen concentration higher than those of regions near the interfaces with regions of the insulating film 6 other than below the gate electrode 7. The thickness of the first oxidized region 4A is larger than those of the second oxidized regions 4B. For example, the thickness (depth) of the first oxidized region 4A is larger than about 2 nm. The oxidized regions 4A and 4B contain GaO, GaON, and the like.

The semiconductor device of this embodiment may be produced by the following method. That is, in the process for forming an insulating film in the method for producing a semiconductor device according to the first embodiment, the insulating film 6 may be formed as follows.

As the insulating film 6, the lower aluminum oxide film 6A is formed on a region of the GaN capping layer 4 below the gate electrode formation region (a region in which a gate electrode is to be formed) and the upper aluminum oxide film 6B is formed on the lower aluminum oxide film 6A and on regions of the GaN capping layer 4 other than below the gate electrode formation region.

Herein, the surface of the nitride semiconductor multi-layer structure 5 is washed with a sulfuric acid-hydrogen peroxide mixture or the like, and an altered layer is washed with hydrofluoric acid and then washing with water is performed.

A lower aluminum oxide film 6A is formed on the GaN capping layer 4 by, for example, an ALD method using an oxidation process (oxygen plasma oxidation process) that uses a raw material gas containing $O_2$ or $O_3$. The thickness of the lower aluminum oxide film 6A may be, for example, about 5 nm to 10 nm and is herein about 10 nm. A CVD method or the like may be employed instead of the ALD method.

Portions of the lower aluminum oxide film 6A other than below the gate electrode formation region are then selectively removed by, for example, wet etching that uses TMAH. Thus, the lower aluminum oxide film 6A is formed on a region of the GaN capping layer 4 below the gate electrode formation region.

An upper aluminum oxide film 6B is then formed on the lower aluminum oxide film 6A and on regions of the GaN capping layer 4 other than below the gate electrode formation region by, for example, an ALD method using an oxidation process (steam oxidation process) that uses a raw material gas containing $H_2O$. The thickness of the upper aluminum oxide film 6B may be, for example, about 10 nm to 100 nm and is herein about 40 nm. A CVD method or the like may be employed instead of the ALD method.

The insulating film 6 is then subjected to an annealing treatment at a temperature of, for example, about 500° C. to 800° C.

Thus, an insulating film having a two-layer structure constituted by the lower aluminum oxide film 6A that is in contact with a surface of the GaN capping layer 4 below the gate electrode formation region and the upper aluminum oxide film 6B stacked on the lower aluminum oxide film 6A so as to be in contact with surfaces of the GaN capping layer 4 other than below the gate electrode formation region is formed as the insulating film 6. In this case, the lower aluminum oxide film 6A has a film density higher than that of the upper aluminum oxide film 6B. The surface of the GaN capping layer 4 is covered with the lower aluminum oxide film 6A in a region below the gate electrode formation region and the upper aluminum oxide film 6B in regions other than below the gate electrode formation region.

In this embodiment, as described above, the lower aluminum oxide film 6A is formed on the entire surface using an oxidation process that uses a raw material gas containing $O_2$ or $O_3$, such as an oxygen plasma oxidation process; portions of the lower aluminum oxide film 6A other than below the gate electrode formation region, that is, portions of the lower aluminum oxide film 6A in regions to be formed into access regions are removed; and the upper aluminum oxide film 6B is then formed on the lower aluminum oxide film 6A using an oxidation process that uses a raw material gas containing $H_2O$, such as a steam oxidation process. On the other hand, in the first embodiment, the lower aluminum oxide film 6A is formed on the entire surface using an oxidation process that uses a raw material gas containing $H_2O$, such as a steam oxidation process; a portion of the lower aluminum oxide film 6A below the gate electrode formation region is removed; and the upper aluminum oxide film 6B is then formed on the lower aluminum oxide films 6A using an oxidation process that uses a raw material gas containing $O_2$ or $O_3$, such as an oxygen plasma oxidation process.

In this case, when the lower aluminum oxide film 6A and the upper aluminum oxide film 6B are formed on the GaN capping layer 4, a near-surface portion of the GaN capping layer 4 is oxidized and thus a first oxidized region 4A and second oxidized regions 4B are formed in the GaN capping layer 4. More specifically, when the lower aluminum oxide film 6A is formed on the GaN capping layer 4, a near-surface portion of the GaN capping layer 4 is oxidized and thus the first oxidized region 4A is formed in the GaN capping layer 4. When the upper aluminum oxide film 6B is formed on the GaN capping layer 4, near-surface portions of the GaN capping layer 4 are oxidized and thus the second oxidized regions 4B are formed in the GaN capping layer 4.

In this case, the GaN capping layer 4 has an oxidized region (first oxidized region) 4A near the interface with the lower aluminum oxide film 6A which is present below the gate electrode formation region and oxidized regions (second oxidized regions) 4B near the interfaces with regions of the upper aluminum oxide film 6B other than below the gate electrode formation region. The first oxidized region 4A has an oxygen concentration higher than those of the second oxidized regions 4B. In other words, the first oxidized region 4A has an oxygen concentration higher than those of regions near the interfaces with regions of the insulating film 6 other than below the gate electrode formation region. The thickness of the first oxidized region 4A is larger than those of the second oxidized regions 4B. For example, the thickness (depth) of the first oxidized region 4A is larger than about 2 nm. The oxidized regions 4A and 4B contain GaO, GaON, and the like.

Other structures and production processes are the same as the first embodiment.

The semiconductor device and the method for producing the semiconductor device according to this embodiment offer an advantage in that a high threshold is achieved while a decrease in drain current is suppressed.

In the above embodiment, the aluminum oxide film (oxide insulating film) is used as the insulating film 6, but the insulating film 6 is not limited thereto. For example, an insulating film containing at least one oxide or oxynitride selected from the group consisting of aluminum, hafnium, tantalum, zirconium, and silicon may be used as the insulating film 6. In other words, the insulating film may include a lower oxide insulating film or a lower oxynitride insulating film disposed on a region of the nitride semiconductor multilayer structure below the gate electrode and an upper oxide insulating film or an upper oxynitride insulating film disposed on the lower oxide insulating film or the lower oxynitride insulating film and on regions of the nitride semiconductor multilayer structure other than below the gate electrode.

In the above embodiment, an AlGaN/GaN-HEMT in which the electron transport layer is composed of GaN and the electron supply layer is composed of AlGaN has been exemplified as a semiconductor device, but the semiconductor device is not limited thereto. For example, this embodiment is also applicable to an InAlN/GaN-HEMT in which the electron transport layer is composed of GaN and the electron supply layer is composed of InAlN or an InAlGaN/GaN-HEMT in which the electron transport layer is composed of GaN and the electron supply layer is composed of InAlGaN. This embodiment is also applicable to semiconductor devices having other nitride semiconductor multilayer structures. For example, the nitride semiconductor multilayer structure 5 may include at least the electron supply layer 3 and electron transport layer 2 and does not necessarily include the capping layer 4.

In this case, the nitride semiconductor layer (electron supply layer 3) constituting an uppermost layer of the nitride semiconductor multilayer structure 5 has an oxidized region (first oxidized region) 4A near the interface with a region of the insulating film 6 below the gate electrode 7, the oxidized region 4A having an oxygen concentration higher than those of regions near the interface with a region of the insulating film 6 other than below the gate electrode 7. Furthermore, the nitride semiconductor layer has second oxidized regions 4B having an oxygen concentration lower than that of the first oxidized region 4A near the interfaces with regions of the insulating film 6 other than below the gate electrode 7. Herein, the electron supply layer 3 is an AlGaN layer. Therefore, the first oxidized region 4A and the second oxidized regions 4B of the nitride semiconductor multilayer structure 5 are oxidized regions composed of AlGaN.

Figure 6:
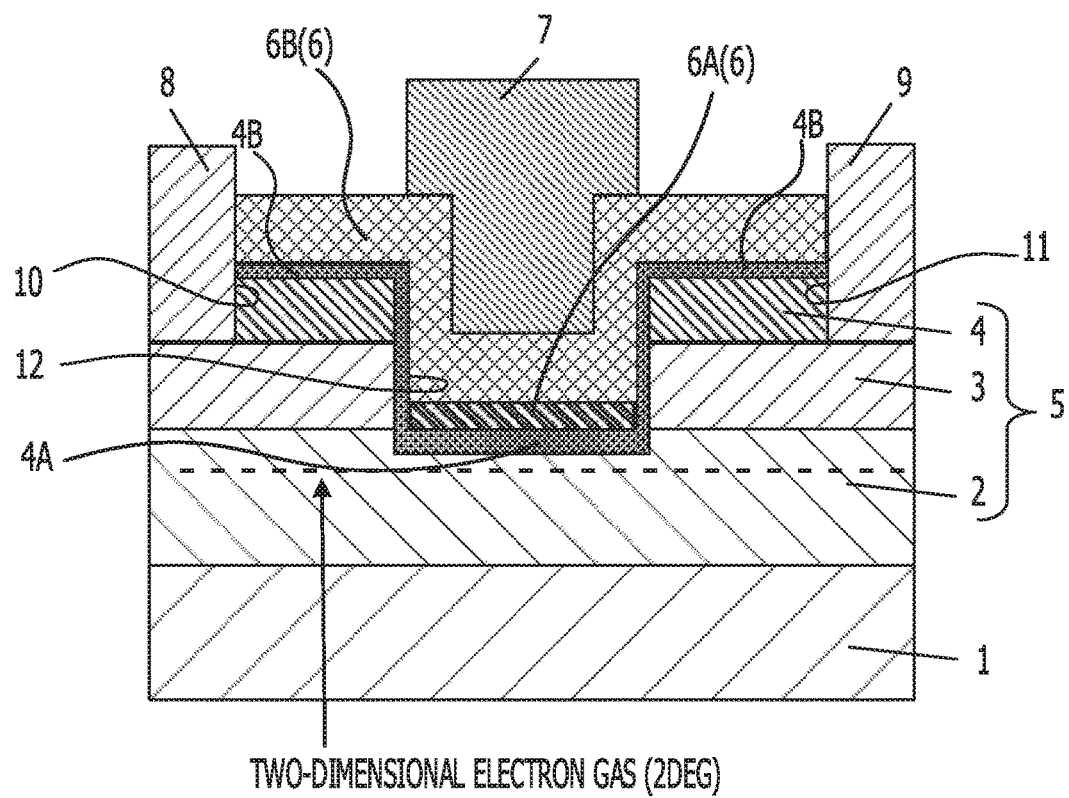
FIG. 6 is a schematic sectional view illustrating a structure of a semiconductor device according to a modification of the second embodiment.

In the above embodiment, an HEMT having no gate recess has been exemplified as a semiconductor device, but the semiconductor device is not limited thereto. For example, this embodiment is also applicable to an HEMT having a gate recess 12 as illustrated in FIG. 6.

In the case of the HEMT having a gate recess 12, the nitride semiconductor multilayer structure 5 of the above embodiment may be changed to a nitride semiconductor multilayer structure having a gate recess 12 and the gate electrode 7 may be formed in the gate recess 12. In other words, the nitride semiconductor multilayer structure 5 may be changed to a nitride semiconductor multilayer structure having a gate recess 12 in which the gate electrode 7 is disposed. For example, part of the gate electrode 7 may be embedded in the gate recess 12. Furthermore, for example, a groove having a depth that reaches the electron transport layer 2 may be formed as the gate recess 12.

In this case, the gate electrode 7 is disposed above the nitride semiconductor multilayer structure 5, that is, above the electron transport layer 2 included in the nitride semiconductor multilayer structure 5. The electron transport layer 2 included in the nitride semiconductor multilayer structure 5 has a first oxidized region 4A near the interface with a region of the insulating film 6 below the gate electrode 7, the first oxidized region 4A having an oxygen concentration higher than those of regions near the interfaces with regions of the insulating film 6 other than below the gate electrode 7. Herein, the electron transport layer 2 is a GaN layer. Therefore, the first oxidized region 4A of the nitride semiconductor multilayer structure 5 is an oxidized region composed of GaN. Furthermore, the nitride semiconductor layer (capping layer 4) constituting an uppermost layer of the nitride semiconductor multilayer structure 5 has second oxidized regions 4B having an oxygen concentration lower than that of the first oxidized region 4A near the interfaces with regions of the insulating film 6 other than below the gate electrode 7. Herein, the capping layer 4 is a GaN layer. Therefore, the second oxidized regions 4B of the nitride semiconductor multilayer structure 5 are oxidized regions composed of GaN. The gate recess 12 is also referred to as a recess, a recess opening, or an electrode groove.

The gate recess 12 may have a depth that reaches the electron supply layer 3. In this case, the gate electrode 7 is disposed above the nitride semiconductor multilayer structure 5, that is, above the electron supply layer 3 included in the nitride semiconductor multilayer structure 5. The electron supply layer 3 included in the nitride semiconductor multilayer structure 5 has a first oxidized region 4A near the interface with a region of the insulating film 6 below the gate electrode 7, the first oxidized region 4A having an oxygen concentration higher than those of regions near the interfaces with regions of the insulating film 6 other than below the gate electrode 7. Herein, the electron supply layer 3 is an AlGaN layer. Therefore, the first oxidized region 4A of the nitride semiconductor multilayer structure 5 is an oxidized region composed of AlGaN. When the electron supply layer 3 is composed of InAlN or InAlGaN, the first oxidized region 4A of the nitride semiconductor multilayer structure 5 is an oxidized region composed of InAlN or InAlGaN.

For example, the nitride semiconductor multilayer structure 5 having the gate recess 12 may include at least the electron supply layer 3 and electron transport layer 2 and does not necessarily include the capping layer 4. In this case, the nitride semiconductor layer (electron supply layer 3) constituting an uppermost layer of the nitride semiconductor multilayer structure 5 has a first oxidized region 4A near the interface with a region of the insulating film 6 below the gate electrode 7, the first oxidized region 4A having an oxygen concentration higher than those of regions near the interfaces with regions of the insulating film 6 other than below the gate electrode 7. Furthermore, the nitride semiconductor layer has second oxidized regions 4B having an oxygen concentration lower than that of the first oxidized region 4A near the interfaces with regions of the insulating film 6 other than below the gate electrode 7. Herein, the electron supply layer 3 is an AlGaN layer. Therefore, the first oxidized region 4A and the second oxidized regions 4B of the nitride semiconductor multilayer structure 5 are oxidized regions composed of AlGaN.

A HEMT having such a gate recess 12 may be produced by a method below. In the production method of the above embodiment, a gate recess 12 is formed after the source electrode groove 10 and the drain electrode groove 11 are formed. Subsequently, the insulating film 6 is formed, the source electrode 8 and the drain electrode 9 are formed, and the gate electrode 7 is formed.

In the process for forming the gate recess 12, the gate recess 12 may be formed in a gate electrode formation region (a region in which a gate electrode is to be formed) of the nitride semiconductor multilayer structure 5. That is, portions of the capping layer 4 and electron supply layer 3 in the gate electrode formation region may be removed by, for example, lithography and dry etching that uses chlorine gas, fluorine gas, or the like to form the gate recess 12. Thus, a groove having a depth that reaches the electron transport layer 2 may be formed as the gate recess 12. Herein, a groove having a depth that reaches the electron transport layer 2 is formed as the gate recess 12, but the structure is not limited thereto. For example, a groove having a depth that reaches the electron supply layer 3 may be formed as the gate recess 12.

[Third Embodiment]

A semiconductor device and a method for producing the semiconductor device according to a third embodiment will now be described with reference to FIG. 7.

The semiconductor device according to this embodiment is different from the semiconductor device according to the first embodiment in terms of the insulating film and the oxidized regions of the nitride semiconductor multilayer structure.

Figure 7:
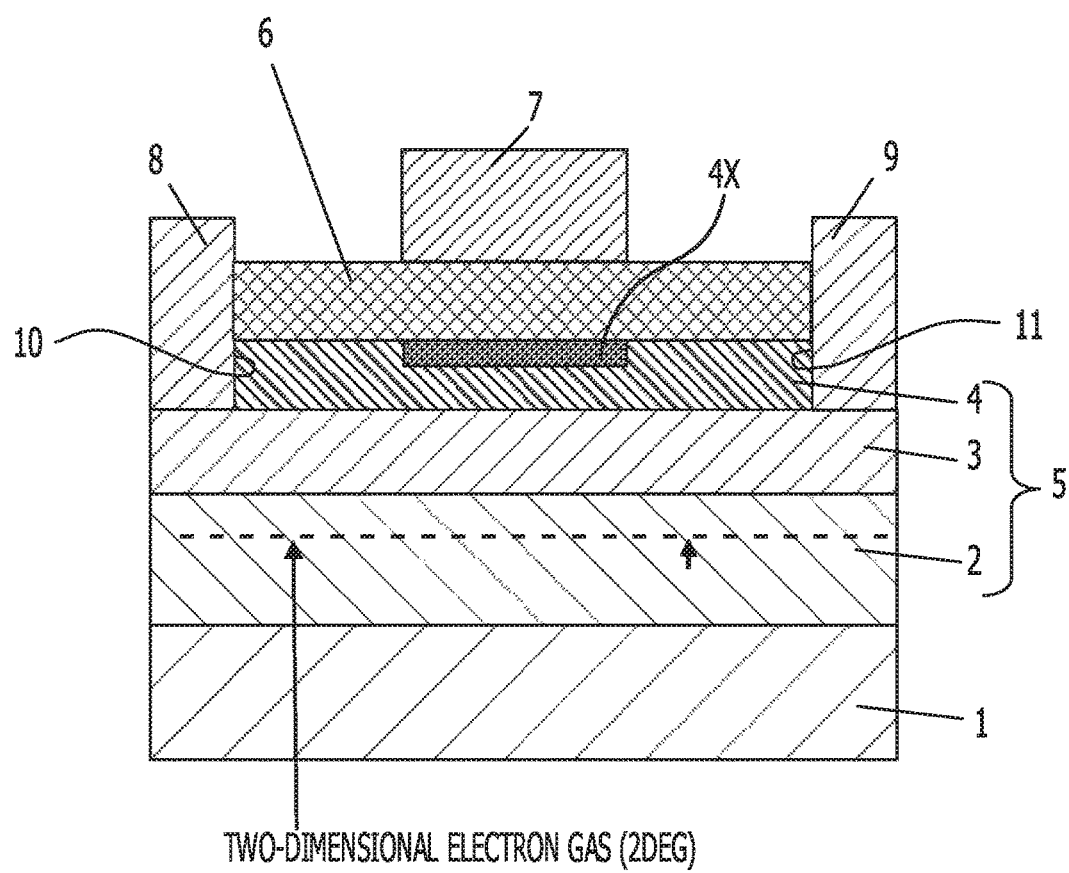
FIG. 7 is a schematic sectional view illustrating a structure of a semiconductor device according to a third embodiment.

In this embodiment, as illustrated in FIG. 7, an oxidized region 4X is present only below the gate electrode 7 near the interface of the GaN capping layer 4 constituting an uppermost layer of the nitride semiconductor multilayer structure 5 with the insulating film 6. In this case, the GaN capping layer 4 has an oxidized region (first oxidized region) 4X near the interface with a region of the insulating film 6 below the gate electrode 7. The gate electrode 7 is disposed above the oxidized region 4X of the GaN capping layer 4 with the insulating film 6 sandwiched therebetween. The GaN capping layer 4 is also referred to as a gallium nitride layer or a nitride semiconductor layer. The oxidized region 4X is also referred to as an oxide layer, a GaN oxide region, or a GaN oxide layer.

The oxidized region 4X may be formed by selectively oxidizing a near-surface portion of the GaN capping layer 4 through an oxygen plasma treatment that uses oxygen plasma as an oxygen source. In this case, the thickness (depth) of the oxidized region 4X is larger than about 2 nm. The oxidized region 4X contains GaO, GaON, and the like. Herein, the oxygen plasma treatment (oxygen plasma oxidation process) is used for an oxidation process, but the oxidation process is not limited thereto. For example, other oxidation processes such as oxygen annealing and oxygen ion implantation may be employed. Such an oxidation process is also referred to as an oxidation process that uses a raw material gas containing $O_2$ or $O_3$.

At the surface of the GaN capping layer 4, that is, at the interface of the GaN capping layer 4 with the insulating film 6, only the oxidized region 4X is preferably oxidized, but a region other than the oxidized region 4X is sometimes inevitably oxidized. Even in such a case, the oxidized region 4X has an oxygen concentration higher than those of the other regions. In other words, the oxidized region 4X has an oxygen concentration higher than those of regions near the interfaces with regions of the insulating film 6 other than below the gate electrode 7.

In this embodiment, the insulating film 6 may be composed of a material such as aluminum oxide, hafnium oxide, silicon oxide, aluminum nitride, hafnium nitride, or silicon nitride. In other words, the insulating film 6 may contain at least one oxide, nitride, or oxynitride of an element selected from the group consisting of aluminum, hafnium, tantalum, zirconium, and silicon. Herein, in the case where the oxidized region 4X is formed in the GaN capping layer 4 as described above, it is preferred that the surface of the GaN capping layer 4 is not oxidized as much as possible when the insulating film 6 is formed on the GaN capping layer 4.

When an oxide insulating film or an oxynitride insulating film is used as the insulating film 6 that is in contact with the GaN capping layer 4, an oxidation process that uses a raw material gas containing $H_2O$, such as a steam oxidation process, is preferably used so that the oxygen concentration in oxidized regions (second oxidized regions) formed near the interfaces of the GaN capping layer 4 with regions of the insulating film 6 other than below the gate electrode 7 is lower than the oxygen concentration in an oxidized region (first oxidized region) formed near the interface of the GaN capping layer 4 with a region of the insulating film 6 below the gate electrode 7. For example, an aluminum oxide film is employed as the insulating film 6, and the aluminum oxide film may be formed using an oxidation process that uses a raw material gas containing $H_2O$, such as a steam oxidation process.

In this case, the GaN capping layer 4 has an oxidized region (first oxidized region) near the interface with a region of the insulating film 6 below the gate electrode 7 and oxidized regions (second oxidized regions) near the interfaces with regions of the insulating film 6 other than below the gate electrode 7. The second oxidized regions have an oxygen concentration lower than that of the first oxidized region. In this case, the first oxidized region has an oxygen concentration higher than those of regions near the interfaces with regions of the insulating film 6 other than below the gate electrode 7. Furthermore, the thickness of the first oxidized region is larger than those of the second oxidized regions. For example, the first oxidized region has a thickness of more than about 2 nm. The insulating film 6 may have a single-layer structure or a multilayer structure in which two or more layers composed of the above materials are stacked on top of each other.

In the semiconductor device of this embodiment, before the process for forming an insulating film in the method for producing a semiconductor device according to the first embodiment, a portion of the GaN capping layer 4 constituting an uppermost layer of the nitride semiconductor multilayer structure 5 may be oxidized by the method below to form an oxidized region (first oxidized region) 4X.

That is, after the source electrode groove 10 and the drain electrode groove 11 are formed, the surface of the nitride semiconductor multilayer structure 5 may be washed with a sulfuric acid-hydrogen peroxide mixture or the like, and an altered layer is washed with hydrofluoric acid and then washing with water is performed.

Subsequently, a near-surface portion of the GaN capping layer 4 below the gate electrode formation region, the GaN capping layer 4 constituting an uppermost layer of the nitride semiconductor multilayer structure 5, is oxidized to form an oxidized region (first oxidized region) 4X in the GaN capping layer 4. For example, a near-surface portion of the GaN capping layer 4 may be selectively oxidized using an oxygen plasma oxidation process. The oxidation process is not limited thereto. Other oxidation processes such as oxygen annealing and oxygen ion implantation, that is, an oxidation process that uses a raw material gas containing $O_2$ or $O_3$ may be employed.

In this case, the GaN capping layer 4 has an oxidized region (first oxidized region) 4X near the interface with a region of the insulating film 6 below the gate electrode 7. The oxidized region 4X has an oxygen concentration higher than those of regions near the interfaces with regions of the insulating film 6 other than below the gate electrode 7. The thickness (depth) of the oxidized region 4X is larger than about 2 nm. The oxidized region 4X contains GaO, GaON, and the like.

Subsequently, the insulating film 6 is formed so as to cover the entire surface of the nitride semiconductor multilayer structure 5. Examples of the material of the insulating film 6 include aluminum oxide, hafnium oxide, silicon oxide, aluminum nitride, hafnium nitride, and silicon nitride. Specifically, an aluminum oxide film is employed as the insulating film 6, and the aluminum oxide film may be formed on the GaN capping layer 4 by, for example, an ALD method using an oxidation process that uses a raw material gas containing $H_2O$, such as a steam oxidation process. In other words, in the case where an oxide insulating film or an oxynitride insulating film is employed as the insulating film, an oxide insulating film or an oxynitride insulating film may be formed on the nitride semiconductor multilayer structure using a raw material gas containing $H_2O$.

In this case, when the aluminum oxide film is formed on the GaN capping layer 4, a near-surface portion of the GaN capping layer 4 is oxidized and thus second oxidized regions having an oxygen concentration lower than that of the first oxidized region 4X are formed in the GaN capping layer 4. That is, the GaN capping layer 4 has an oxidized region (first oxidized region) 4X near the interface with a region of the aluminum oxide film below the gate electrode 7 and oxidized regions (second oxidized regions) near the interfaces with regions of the aluminum oxide film other than below the gate electrode 7. The first oxidized region 4X has an oxygen concentration higher than those of the second oxidized regions. In other words, the first oxidized region 4X has an oxygen concentration higher than those of regions near the interfaces with regions of the insulating film 6 other than below the gate electrode 7. The first oxidized region 4X has a thickness larger than those of the second oxidized regions. For example, the thickness (depth) of the first oxidized region 4X is larger than about 2 nm. The oxidized region 4X contains GaO, GaON, and the like. The thickness of the aluminum oxide film 6 may be, for example, about 10 nm to 100 nm and is herein about 40 nm. A CVD method or the like may be employed instead of the ALD method. After that, the insulating film 6 is subjected to an annealing treatment at a temperature of, for example, about 500° C. to 800° C.

Thus, the entire surface of the GaN capping layer 4 having the first oxidized region 4X below the gate electrode formation region is covered with the insulating film 6 (aluminum oxide film).

Portions of the insulating film 6 (aluminum oxide film) formed in the source electrode groove 10 and the drain electrode groove 11 may be removed by, for example, wet etching that uses TMAH, the source electrode 8 and the drain electrode 9 may be formed, and then the gate electrode 7 may be formed. Herein, the gate electrode 7 is formed above the first oxidized region 4X of the GaN capping layer 4 with the insulating film 6 (aluminum oxide film) sandwiched therebetween. In other words, the gate electrode 7 is formed above the first oxidized region 4X having an oxygen concentration higher than those of the second oxidized regions formed near the interface of the nitride semiconductor multilayer structure with the oxide insulating film or the oxynitride insulating film so that the oxide insulating film or the oxynitride insulating film is sandwiched between the gate electrode 7 and the nitride semiconductor multilayer structure.

Other structures and production processes are the same as the first embodiment.

The semiconductor device and the method for producing the semiconductor device according to this embodiment offer an advantage in that a high threshold is achieved while a decrease in drain current is suppressed.

In the above embodiment, an AlGaN/GaN-HEMT in which the electron transport layer is composed of GaN and the electron supply layer is composed of AlGaN has been exemplified as a semiconductor device, but the semiconductor device is not limited thereto. For example, this embodiment is also applicable to an InAlN/GaN-HEMT in which the electron transport layer is composed of GaN and the electron supply layer is composed of InAlN or an InAlGaN/GaN-HEMT in which the electron transport layer is composed of GaN and the electron supply layer is composed of InAlGaN. This embodiment is also applicable to semiconductor devices having other nitride semiconductor multilayer structures. For example, the nitride semiconductor multilayer structure 5 may include at least the electron supply layer 3 and electron transport layer 2 and does not necessarily include the capping layer 4.

In this case, the nitride semiconductor layer (electron supply layer 3) constituting an uppermost layer of the nitride semiconductor multilayer structure 5 has an oxidized region (first oxidized region) 4X near the interface with a region of the insulating film 6 below the gate electrode 7, the oxidized region 4X having an oxygen concentration higher than those of regions near the interfaces with regions of the insulating film 6 other than below the gate electrode 7. Herein, the electron supply layer 3 is an AlGaN layer. Therefore, the first oxidized region 4X of the nitride semiconductor multilayer structure 5 is an oxidized region composed of AlGaN.

Figure 8:
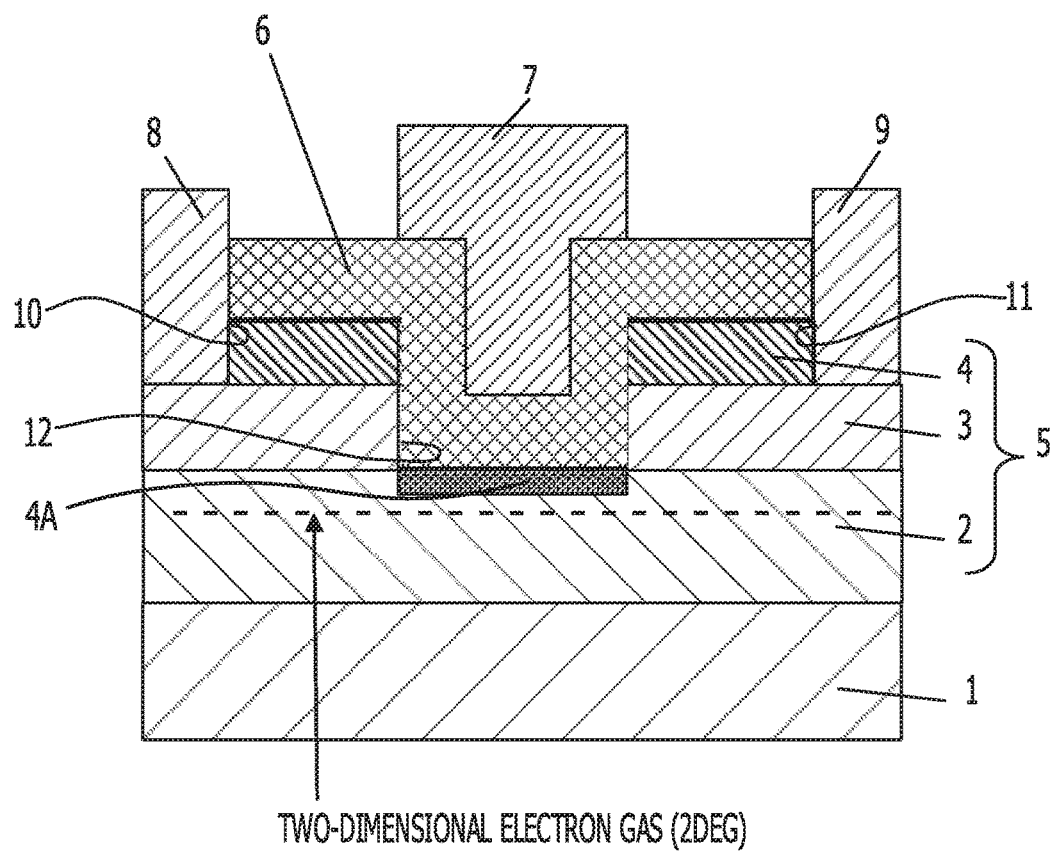
FIG. 8 is a schematic sectional view illustrating a structure of a semiconductor device according to a modification of the third embodiment.

In the above embodiment, an HEMT having no gate recess has been exemplified as a semiconductor device, but the semiconductor device is not limited thereto. For example, this embodiment is also applicable to an HEMT having a gate recess 12 as illustrated in FIG. 8.

In the case of the HEMT having a gate recess 12, the nitride semiconductor multilayer structure 5 of the above embodiment may be changed to a nitride semiconductor multilayer structure having a gate recess 12 and the gate electrode 7 may be disposed in the gate recess 12. In other words, the nitride semiconductor multilayer structure 5 may be changed to a nitride semiconductor multilayer structure having a gate recess 12 in which the gate electrode 7 is disposed. For example, part of the gate electrode 7 may be embedded in the gate recess 12. Furthermore, for example, a groove having a depth that reaches the electron transport layer 2 may be formed as the gate recess 12. In this case, the gate electrode 7 is disposed above the nitride semiconductor multilayer structure 5, that is, above the electron transport layer 2 included in the nitride semiconductor multilayer structure 5.

The electron transport layer 2 included in the nitride semiconductor multilayer structure 5 has a first oxidized region 4X near the interface with a region of the insulating film 6 below the gate electrode 7, the first oxidized region 4X having an oxygen concentration higher than those of regions near the interfaces with regions of the insulating film 6 other than below the gate electrode 7. Herein, the electron transport layer 2 is a GaN layer. Therefore, the first oxidized region 4X of the nitride semiconductor multilayer structure 5 is an oxidized region composed of GaN. The gate recess 12 is also referred to as a recess, a recess opening, or an electrode groove.

The gate recess 12 may have a depth that reaches the electron supply layer 3. In this case, the gate electrode 7 is disposed above the nitride semiconductor multilayer structure 5, that is, above the electron supply layer 3 included in the nitride semiconductor multilayer structure 5. The electron supply layer 3 included in the nitride semiconductor multilayer structure 5 has a first oxidized region 4X near the interface with a region of the insulating film 6 below the gate electrode 7, the first oxidized region 4X having an oxygen concentration higher than those of regions near the interfaces with regions of the insulating film 6 other than below the gate electrode 7. Herein, the electron supply layer 3 is an AlGaN layer. Therefore, the first oxidized region 4X of the nitride semiconductor multilayer structure 5 is an oxidized region composed of AlGaN. When the electron supply layer 3 is composed of InAlN or InAlGaN, the first oxidized region 4X of the nitride semiconductor multilayer structure 5 is an oxidized region composed of InAlN or InAlGaN.

For example, the nitride semiconductor multilayer structure 5 having the gate recess 12 may include at least the electron supply layer 3 and electron transport layer 2 and does not necessarily include the capping layer 4. In this case, the nitride semiconductor layer (electron supply layer 3) constituting an uppermost layer of the nitride semiconductor multilayer structure 5 has an oxidized region (first oxidized region) 4X near the interface with a region of the insulating film 6 below the gate electrode 7, the first oxidized region 4X having an oxygen concentration higher than those of regions near the interfaces with regions of the insulating film 6 other than below the gate electrode 7. Herein, the electron supply layer 3 is an AlGaN layer. Therefore, the first oxidized region 4X of the nitride semiconductor multilayer structure 5 is an oxidized region composed of AlGaN.

A HEMT having such a gate recess 12 may be produced by a method below. In the production method of the above embodiment, a gate recess 12 is formed after the source electrode groove 10 and the drain electrode groove 11 are formed. Subsequently, the oxidized region 4X is formed, the insulating film 6 is formed, the source electrode 8 and the drain electrode 9 are formed, and the gate electrode 7 is formed.

In the process for forming the gate recess 12, the gate recess 12 may be formed in a gate electrode formation region (a region in which a gate electrode is to be formed) of the nitride semiconductor multilayer structure 5. That is, portions of the capping layer 4 and electron supply layer 3 in the gate electrode formation region may be removed by, for example, lithography and dry etching that uses chlorine gas, fluorine gas, or the like to form the gate recess 12. Thus, a groove having a depth that reaches the electron transport layer 2 may be formed as the gate recess 12. Herein, a groove having a depth that reaches the electron transport layer 2 is formed as the gate recess 12, but the structure is not limited thereto. For example, a groove having a depth that reaches the electron supply layer 3 may be formed as the gate recess 12.

[Fourth Embodiment]

A power supply device according to a fourth embodiment will now be described with reference to FIG. 9.

The power supply device according to this embodiment includes the semiconductor device (HEMT) according to any one of the first to third embodiments and the modifications thereof.

Figure 9:
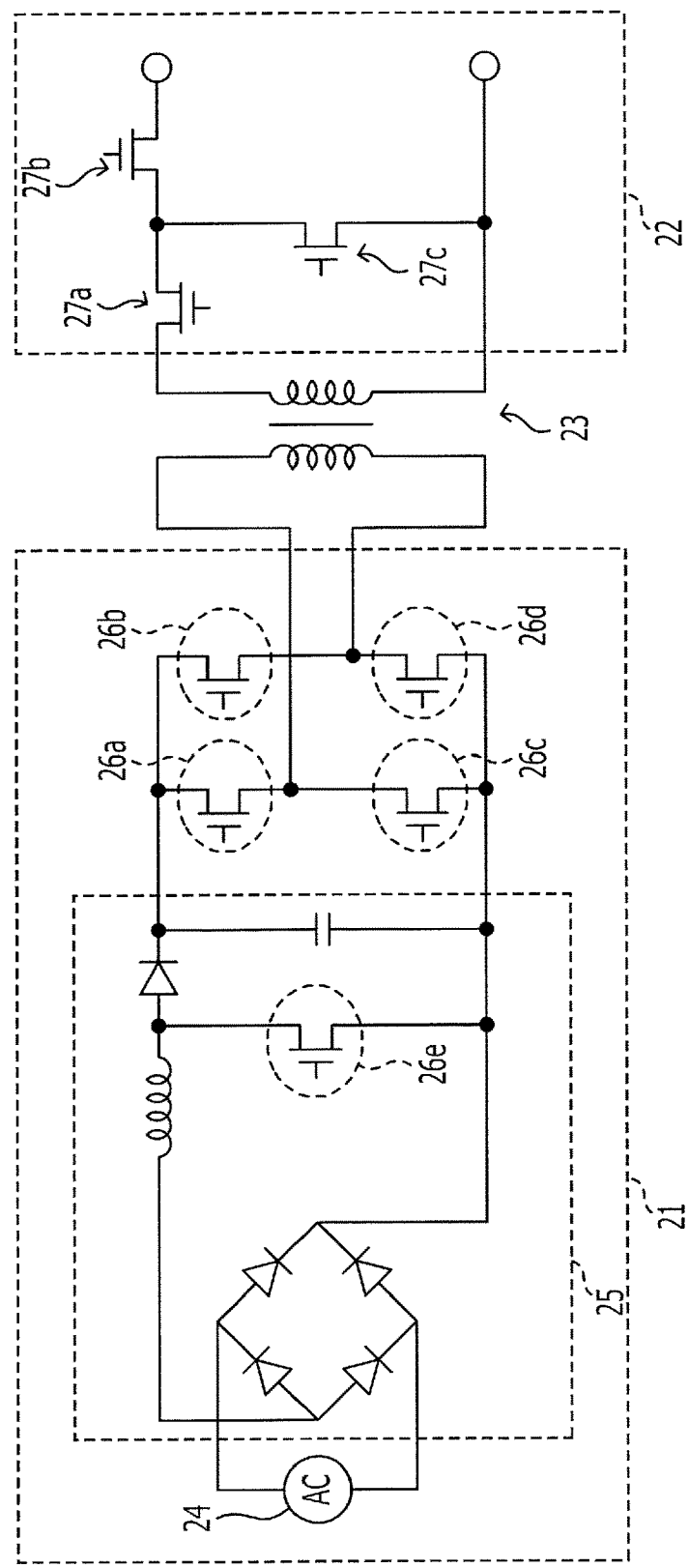
FIG. 9 is a schematic view illustrating a structure of a power supply device according to a fourth embodiment.

As illustrated in FIG. 9, the power supply device includes a high-voltage primary circuit (high-voltage circuit) 21, a low-voltage secondary circuit (low-voltage circuit) 22, and a transformer 23 disposed between the primary circuit 21 and the secondary circuit 22.

The primary circuit 21 includes an AC power supply 24, a so-called bridge rectifier circuit 25, and a plurality of switching elements 26a, 26b, 26c, and 26d (herein, the number thereof is four). The bridge rectifier circuit 25 includes a switching element 26e.

The secondary circuit 22 includes a plurality of switching elements 27a, 27b, and 27c (herein, the number thereof is three).

In this embodiment, the switching elements 26a, 26b, 26c, 26d, and 26e of the primary circuit 21 correspond to the HEMT according to any one of the first to third embodiments and the modifications thereof. The switching elements 27a, 27b, and 27c of the secondary circuit 22 are common MIS-FETs that use silicon.

Accordingly, there is an advantage in that the power supply device according to this embodiment achieves high reliability because the semiconductor device (HEMT) according to any one of the first to third embodiments and the modifications thereof is used in the high-voltage circuit 21.

[Fifth Embodiment]

A high-frequency amplifier according to a fifth embodiment will now be described with reference to FIG. 10.

The high-frequency amplifier according to this embodiment includes the semiconductor device (HEMT) according to any one of the first to third embodiments and the modifications thereof.

Figure 10:
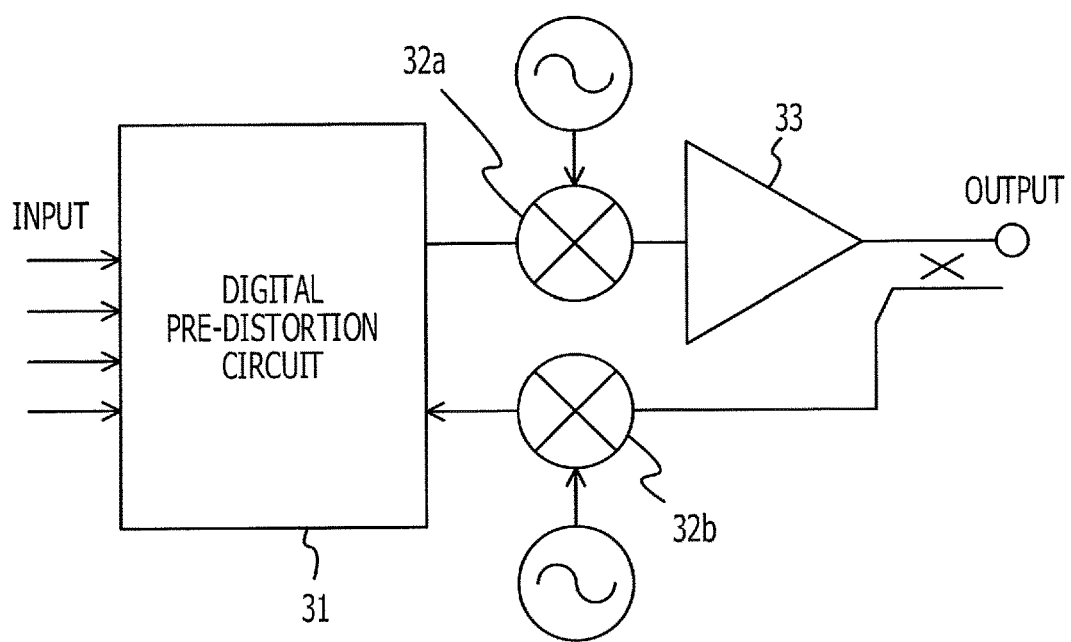
FIG. 10 is a schematic view illustrating a structure of a high-frequency amplifier according to a fifth embodiment.

As illustrated in FIG. 10, the high-frequency amplifier includes a digital pre-distortion circuit 31, mixers 32a and 32b, and a power amplifier 33. The power amplifier 33 is also simply referred to as an amplifier.

The digital pre-distortion circuit 31 compensates for a nonlinear distortion of an input signal. The mixers 32a and 32b mix an AC signal with the input signal whose nonlinear distortion is compensated for.

The power amplifier 33 amplifies the input signal that has been mixed with the AC signal and includes the HEMT according to any one of the first to third embodiments and the modifications thereof.

In FIG. 10, an output side signal and an AC signal are made to be mixed by the mixer 32b and sent to the digital pre-distortion circuit 31 by, for example, switching a switch.

Accordingly, there is an advantage in that the high-frequency amplifier according to this embodiment achieves high reliability because the semiconductor device (HEMT) according to any one of the first to third embodiments and the modifications thereof is used in the power amplifier 33.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a nitride semiconductor multilayer;
   an insulating film disposed on the nitride semiconductor multilayer; and
   a gate electrode disposed on the insulating film,
   wherein the insulating film includes
   a lower oxide insulating film or a lower oxynitride insulating film disposed on a region of the nitride semiconductor multilayer below the gate electrode and
   an upper oxide insulating film or an upper oxynitride insulating film disposed
   on the lower oxide insulating film or the lower oxynitride insulating film and
   on a region of the nitride semiconductor multilayer other than directly below the gate electrode; and
   the nitride semiconductor multilayer has
   a first oxidized region near the lower oxide insulating film or the lower oxynitride insulating film and
   a second oxidized region near the upper oxide insulating film or the upper oxynitride insulating film,
   the first oxidized region having an oxygen concentration higher than an oxygen concentration of the second oxidized region,
   wherein the lower oxide insulating film or the lower oxynitride insulating film has a film density higher than a film density of the upper oxide insulating film or the upper oxynitride insulating film.

2. A method for producing a semiconductor device, comprising:
   forming a lower oxide insulating film or a lower oxynitride insulating film on a nitride semiconductor multilayer using a raw material gas containing $H_2O$;
   forming a gate recess by removing a portion of the lower oxide insulating film or lower oxynitride insulating film;
   forming an upper oxide insulating film or an upper oxynitride insulating film on the nitride semiconductor multilayer and the lower oxide insulating film or the lower oxynitride insulating film using a raw material gas containing $O_2$, or $O_3$; and
   by annealing a surface of the upper oxide insulating film or an upper oxynitride insulating film,
   forming a first oxidized region on a surface of the nitride semiconductor multilayer directly below the gate recess and forming a second oxidized region on the surface of the nitride semiconductor multilayer except below the gate recess,
   wherein an oxygen concentration of the first oxidized region is higher than an oxygen concentration of the second oxidized region.

3. The method according to claim 2,
   wherein the first oxidized region has a thickness larger than a thickness of the second oxidized region.

4. The method according to claim 2,
   wherein the method further includes:
   forming the lower oxide insulating film or the lower oxynitride insulating film on the nitride semiconductor multilayer using a raw material gas containing $O_2$ or $O_3$;
   performing the removing the portion of the lower oxide insulating film or lower oxynitride insulating film;
   forming the upper oxide insulating film or the upper oxynitride insulating film on the nitride semiconductor multilayer and the lower oxide insulating film or the lower oxynitride insulating film using a raw material gas containing $H_2O$;
   forming a gate electrode above the first oxidized region having an oxygen concentration higher than an oxygen concentration of a second oxidized region so that the lower oxide insulating film or the lower oxynitride insulating film and the upper oxide insulating film or the upper oxynitride insulating film are sandwiched between the gate electrode and the first oxidized region, the first oxidized region being formed near an interface of the nitride semiconductor multilayer with the lower oxide insulating film or the lower oxynitride insulating film, the second oxidized region being formed near an interface of the nitride semiconductor multilayer with the upper oxide insulating film or the upper oxynitride insulating film.

5. The method according to claim 2, further comprising:
   forming the nitride semiconductor multilayer including an electron transport layer, an electron supply layer, and a capping layer before the forming an insulating film; and
   forming the insulating film on the capping layer.

6. The method according to claim 2, further comprising, before forming an insulating film:
   forming the nitride semiconductor multilayer including an electron transport layer and an electron supply layer; and
   forming, in the nitride semiconductor multilayer, a recess in which the gate electrode is to be formed,
   wherein the forming the insulating film includes forming the insulating film on the electron transport layer or electron supply layer that is exposed at a bottom surface of the recess.

* * * * *